(12) United States Patent
Liaw

(10) Patent No.: US 12,419,026 B2
(45) Date of Patent: Sep. 16, 2025

(54) MEMORY STRUCTURE

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 613 days.

(21) Appl. No.: 17/853,024

(22) Filed: Jun. 29, 2022

(65) Prior Publication Data

US 2024/0008241 A1    Jan. 4, 2024

(51) Int. Cl.
*H10B 10/00* (2023.01)
*H10D 30/43* (2025.01)
*H10D 30/67* (2025.01)
*H10D 62/10* (2025.01)

(52) U.S. Cl.
CPC .......... *H10B 10/125* (2023.02); *H10D 30/43* (2025.01); *H10D 30/6729* (2025.01); *H10D 30/6735* (2025.01); *H10D 30/6757* (2025.01); *H10D 62/121* (2025.01)

(58) Field of Classification Search
CPC .. H10B 10/125; H10D 30/43; H10D 30/6729; H10D 30/6735; H10D 30/6757; H10D 62/121; H10D 30/014; H10D 89/10; B82Y 10/00
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,332,893 B2* | 6/2019 | Nelson | H10B 10/18 |
| 2022/0336474 A1* | 10/2022 | Liaw | H01L 23/528 |

* cited by examiner

*Primary Examiner* — Allison Bernstein
(74) *Attorney, Agent, or Firm* — Cooper Legal Group, LLC

(57) ABSTRACT

A memory structure includes a static random access memory (SRAM) cell having a first pass-gate transistor and a second pass-gate transistor, a word-line conductor extending in a first direction, a first source/drain contact, a second source/drain contact, a bit-line conductor in a second direction, and a bit-line-bar conductor extending in the second direction. The second direction is perpendicular to the first direction. The word-line conductor is over and electrically connected to gate electrodes of the first pass-gate transistor and the second pass-gate transistor. The first source/drain contact is under and electrically connected to a source/drain feature of the first pass-gate transistor. The second source/drain contact is under and electrically connected to a source/drain feature of the second pass-gate transistor. The bit-line conductor is under and electrically connected to the first source/drain contact. The bit-line conductor is under and electrically connected to the second source/drain contact.

20 Claims, 35 Drawing Sheets

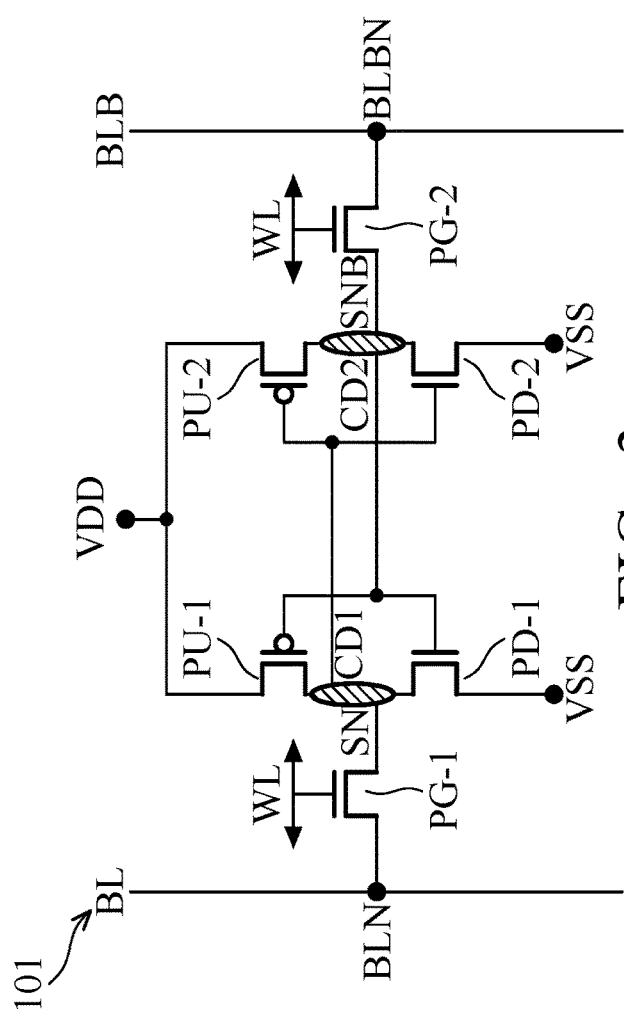
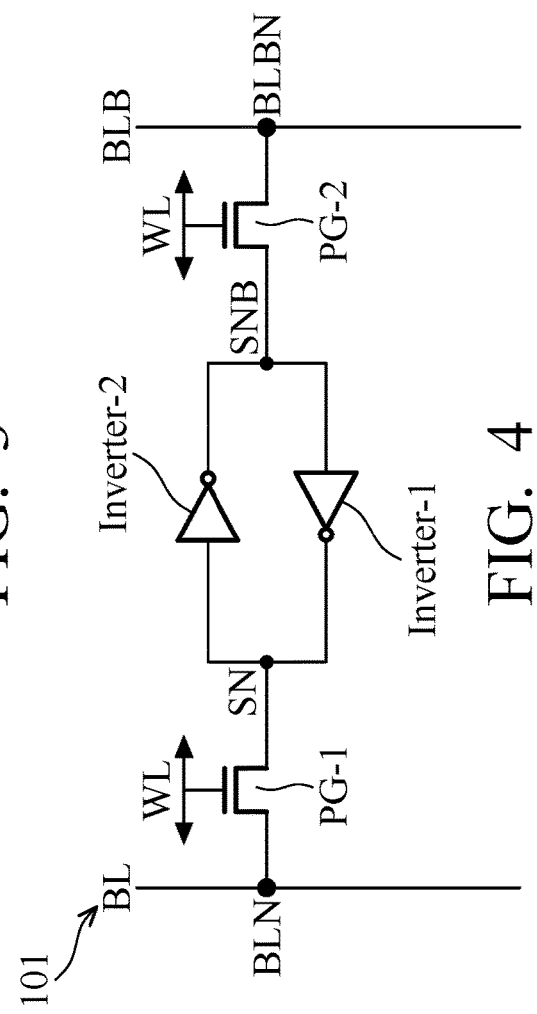
FIG. 3
FIG. 4

MEMORY STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) to reduce chip footprint while maintaining reasonable processing margins.

However, as GAA transistors and circuit cells continue to be scaled down, interconnection routing for memory array uses too many routing resources and therefore impact the cell scaling as well as cell performance. Accordingly, although existing technologies for fabricating memory array including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 and 4 are circuit diagrams of an SRAM circuit that can be implemented in an SRAM cell of an array in the memory region of FIG. 1, in accordance with some alternative embodiments of the present disclosure.

DETAILED DESCRIPTION

Figure 1:
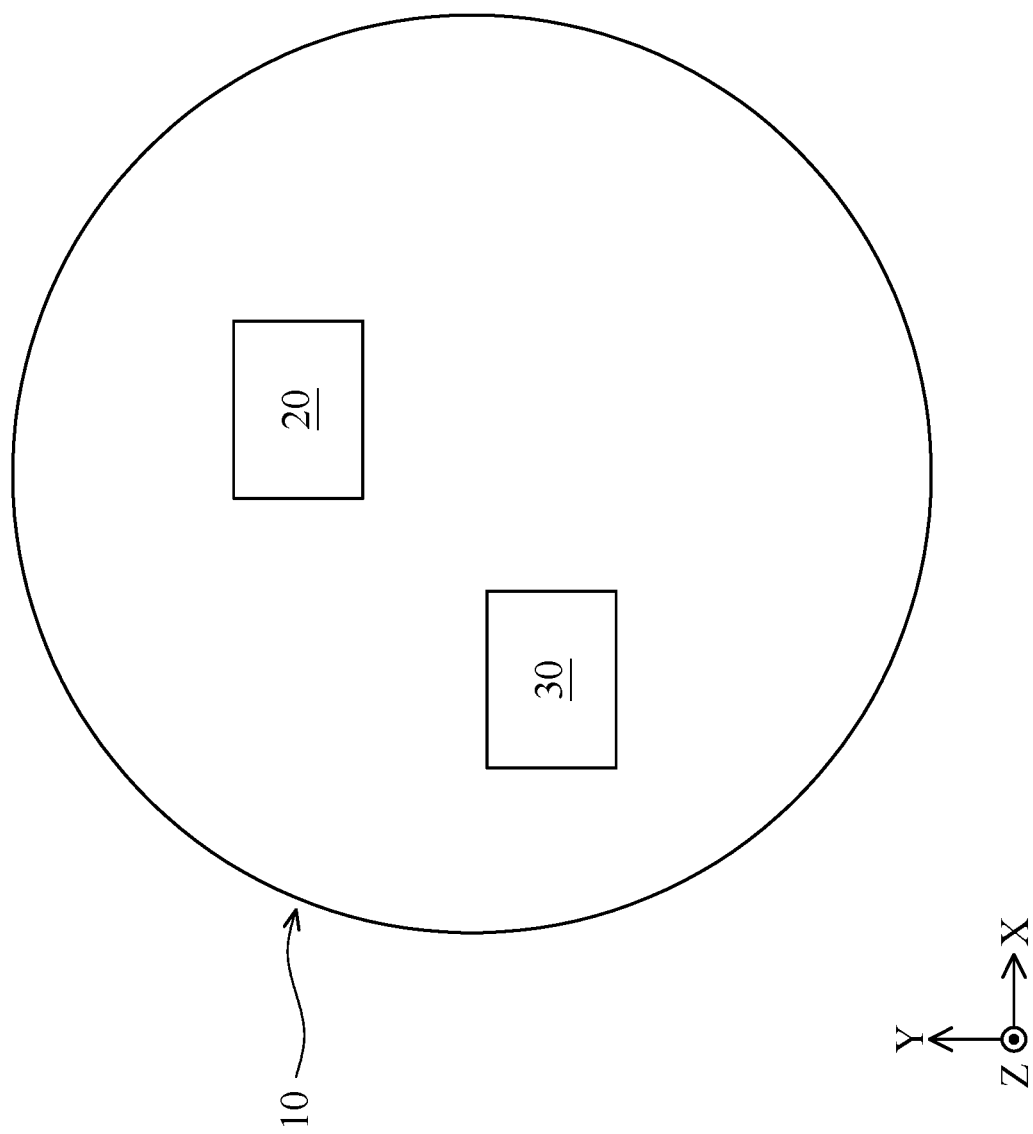
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to memory structures, and more particularly to an array of static random-access memory (SRAM) cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include an array of SRAM cells with bit-line conductors and bit-line-bar conductors under the SRAM cells (more specifically, functional transistors), such that improve cell performance and reduce routing complexity for SRAM cells. The details of the present disclosure are described below in conjunction with the accompanying drawings, which illustrate the layout and structure of circuit cells, according to some embodiments.

FIG. 1 is a fragmentary diagrammatic top view of an integrated circuit (IC) chip 10, in portion or entirety, in accordance with some embodiments of the present disclosure. IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, IC chip 10 includes a memory region 20 and a logic region 30. Memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnection structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of IC chip 10.

Figure 2:
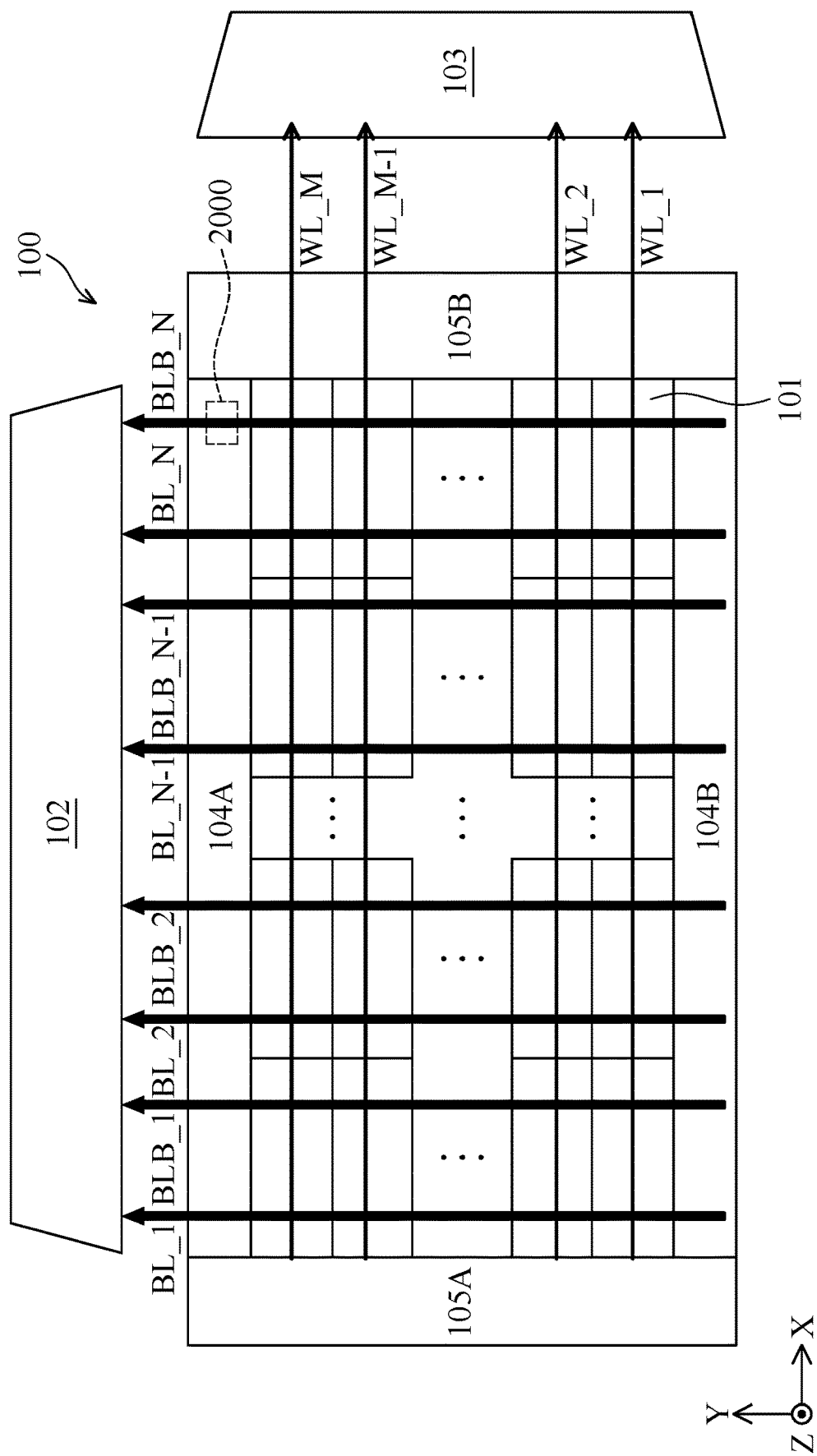
FIG. 2 is a fragmentary diagrammatic top view of an array of SRAM cells that can be implemented in the memory region of FIG. 1, in accordance with some alternative embodiments of the present disclosure.

FIG. 2 is a fragmentary diagrammatic top view of an array 100 of SRAM cells 101 that can be implemented in the memory region 20 of FIG. 1, in accordance with some alternative embodiments of the present disclosure. FIG. 2 has been simplified for the sake of clarity to better understand the inventive concepts of the present disclosure. Additional features can be added in the array 100, and some of the features described below can be replaced, modified, or eliminated in other embodiments of the array 100.

The array 100 includes SRAM cells 101 arranged with pluralities of columns and rows. Each of columns of the SRAM cells 101 includes a bit line pair extending in a Y-direction, such as a bit-line conductor (BL_1, BL_2, . . . , BL_N−1, BL_N) and a bit-line-bar conductor (also referred to as a complementary bit line) (BLB_1, BLB_2, BLB_N−1, BLB_N), that facilitate reading data from and/or writing data to respective SRAM cells 101 in true form and complementary form on a column-by-column basis. Each of rows of the SRAM cells 101 includes a word-line conductor (WL_1, WL_2, . . . , WL_M−1, WL_M) extending in an X-direction perpendicular to the Y-direction, that facilitates access to respective SRAM cells 101 on a row-by-row basis. Each of SRAM cells 101 is electrically connected to a respective bit-line conductor, a respective bit-line-bar conductor, and a respective word-line conductor, in which the bit-line conductors and the bit-line-bar conductors are electrically connected to a controller 102 and the word-line conductors are electrically connected to a controller 103.

The controllers 102 and 103 include any circuitry suitable to facilitate read/write operations from/to the SRAM cells 101, including but not limited to, a column decoder circuit, a row decoder circuit, a column selection circuit, a row selection circuit, a read/write circuit (for example, configured to read data from and/or write data to the SRAM cells 101 corresponding to a selected bit line pair (in other words, a selected column)), other suitable circuit, or combinations thereof. In some implementations, the controllers 102 and 103 includes at least one sense amplifier configured to detect and/or amplify a voltage differential of a selected bit line pair. In some implementations, the sense amplifier is configured to latch or otherwise store data values of the voltage differential.

The array 100 further includes edge cell regions 105A and 105B on edges of the array 100 in the Y-direction. The edge cell regions 105A and 105B include dummy cells for ensuring uniformity in performance of SRAM cells 101. Dummy cells are configured physically and/or structurally similar to SRAM cells 106, but do not store data. For example, dummy cells may include p-type wells, n-type wells, nanostructures, gate structures, source/drain features, and/or contact features.

The array 100 also includes edge strap regions 104A and 104B on edges of the array 100 in the X-direction. The edge strap regions 104A and 104B does not contain SRAM cells and is used for implementing well pick-up structures or well strap cells configured to electrically couple a voltage to an n-well or a p-well of the SRAM cells 101.

In the present disclosure, some conductors for interconnection of the array 100 of the SRAM cells 101 are disposed under the SRAM cells 101 (on back-side of the SRAM cells 101). For example, the bit-line conductors (BL_1, BL_2, . . . , BL_N−1, BL_N) and the bit-line-bar conductors (BLB_1, BLB_2, . . . , BLB_N−1, BLB_N) shown in FIG. 2 are disposed under and electrically connected to the SRAM cells 101, will discussed in below. In order to electrically connect the bit-line conductors and the bit-line-bar conductors to the controller 102, the bit-line conductors and the bit-line-bar conductors under the SRAM cells 101 are routed to front-side conductors over the SRAM cells 101 through tap structures (e.g., tap structures 2000) located in the edge strap regions 104A or 104B, and then the front-side conductors are electrically connected to the controller 102. In some embodiments, the conductors for word-lines, VDD lines, or VSS lines disposed under the SRAM cells 101 may also be routed to the front-side conductors over the SRAM cells 101 through the tap structures located in the edge strap regions 104A/104B and the edge cell regions 105A/105B. The details of the tap structures are described below.

FIG. 3 and FIG. 4 are circuit diagrams of an SRAM circuit that can be implemented in an SRAM cell (e.g., the SRAM cell 101 in FIG. 2) of an array in the memory region 20 of FIG. 1, in accordance with some alternative embodiments of the present disclosure. The circuit diagram of SRAM cell is merely exemplary, and in some embodiments, each of SRAM cells (e.g., SRAM cells 101A to 101K in FIGS. 7A to 18B) in the array is configured with an SRAM circuit similar to the SRAM cell 101 and as shown in FIG. 3 and FIG. 4. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter-1. In operation, pass-gate transistor PG-1 and pass-gate transistor PG-2 provide access to the storage portion of their respective SRAM cell (i.e., Inverter-1 and Inverter-2) and can also be referred to as access transistors of their respective SRAM cell. Each of SRAM cells (e.g., the SRAM cells 101A to 101K in FIGS. 7A to 18B) is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node (or voltage source) VDD, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) VSS, and the first common drain. A gate of pull-up transistor PU-2 interposes a source, which is electrically coupled to the first power supply voltage via voltage node VDD, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node VSS, and the second common drain. The first common drain provides a storage node SN that stores data in true form, and the second common drain provides a storage node SNB that stores data in complementary form, or vice versa, in some embodiments. The gate of pull-up transistor PU1 and the gate of pull-down transistor PD-1 are coupled together and to the second common drain SD2, and the gate of pull-up transistor PU-2 and the gate of pull-down transistor PD-2 are coupled together and to the first common drain SD1. A gate of pass-gate transistor PG-1 interposes a drain connected to a bit line node BLN, which is electrically coupled to a bit line BL, and a source, which is electrically coupled to the first common drain SD1. A gate of pass-gate transistor PG-2 interposes a drain connected to a complementary bit line node BLBN, which is electrically coupled to a complementary bit line BLB, and a source, which is electrically coupled to the second common drain SD2. Gates of pass-gate transistors PG-1, PG-2 are connected to and controlled by a word line WL, which allows selection of a respective SRAM cell, such as the SRAM cell 101A, for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to gates of pass-gate transistors PG-1, PG-2 by word line WL. In some embodiments, SRAM cells are single-port SRAMs. In some embodiments, SRAM cells are configured as multi-port SRAMs, such as dual-port SRAMs, and/or with more or less transistors than depicted, such as 8T SRAMs. FIG. 3 and FIG. 4 have been simplified for the sake of clarity to better understand the inventive concepts of the present disclosure.

Additional features can be added in the SRAM circuits of FIG. 3 and FIG. 4, and some of the features described herein can be replaced, modified, or eliminated in other embodiments of the SRAM circuits of FIG. 3 and FIG. 4.

Figure 5:
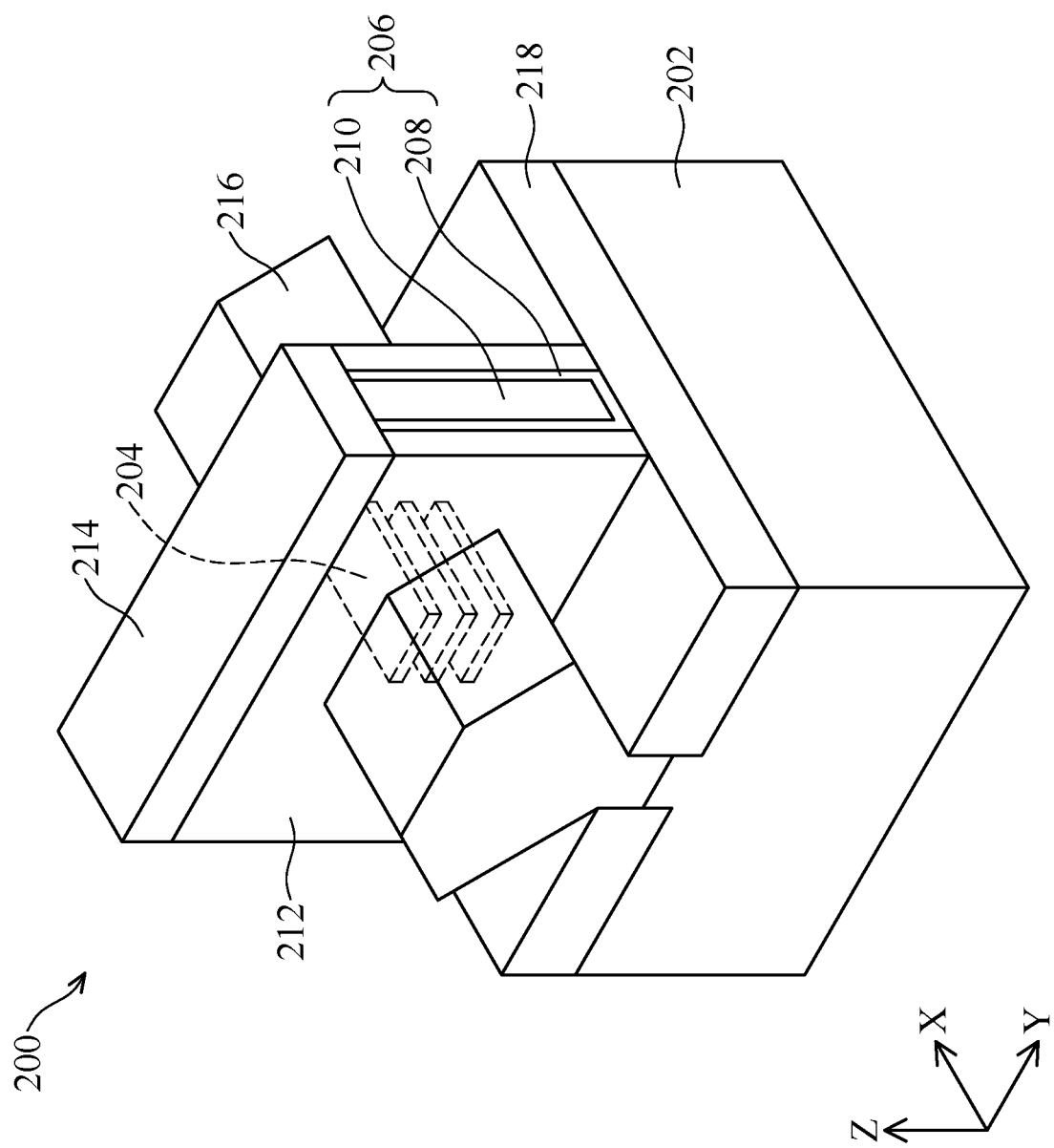
FIG. 5 is a perspective view of a GAA transistor in an array of SRAM cells, in accordance with some embodiments of the present disclosure.

Each of the SRAM cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 5. However, it should be understood that the application should not be limited to a particular type of device, except as specifically claimed.

Referring to FIG. 5, a perspective view of an exemplary GAA transistor 200 is illustrated. The GAA transistor 200 is formed over a substrate 202. The substrate 202 may contains a semiconductor material, such as bulk silicon (Si). In some embodiments, after the resultant GAA transistor 200 is formed, the substrate 202 may be removed by a suitable process (e.g., a chemical mechanical polishing (CMP) process) for forming back-side interconnection.

The GAA transistor 200 also includes one or more nanostructures 204 (dash lines) extending in an X-direction and vertically stacked (or arranged) in a Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 5, may refer to FIGS. 7D, 7F, and 7G). As shown in FIG. 5, gate spacers 212 are on sidewalls of the gate structure 206 and over the nanostructures 204 (not shown in FIG. 2, may refer to FIGS. 7F and 7G). A gate top dielectric layer 214 is over the gate dielectric layer 208, the gate electrode 210, and the nanostructures 204. The gate top dielectric layer 214 is used for contact etch protection layer.

The GAA transistor 200 further includes source/drain features 216. As shown in FIG. 5, two source/drain features 216 are on opposite sides of the gate structure 206. The nanostructures 204 (dash lines) extends in the X-direction to connect one source/drain feature 216 to the other source/drain feature 216. The source/drain features 216 may also be referred to as source/drain, or source/drain regions. In some embodiments, source/drain feature(s) may refer to a source or a drain, individually or collectively dependent upon the context.

Isolation feature 218 is over the substrate 202 and under the gate dielectric layer 208, the gate electrode 210, and the gate spacers 212. The isolation feature 218 is used for isolating the GAA transistor 200 from other devices. In some embodiments, the isolation feature 218 may include different structures, such as shallow trench isolation (STI) structure, deep trench isolation (DTI) structure. Therefore, the isolation feature 218 is also referred as to as a STI feature or DTI feature.

Figure 6:
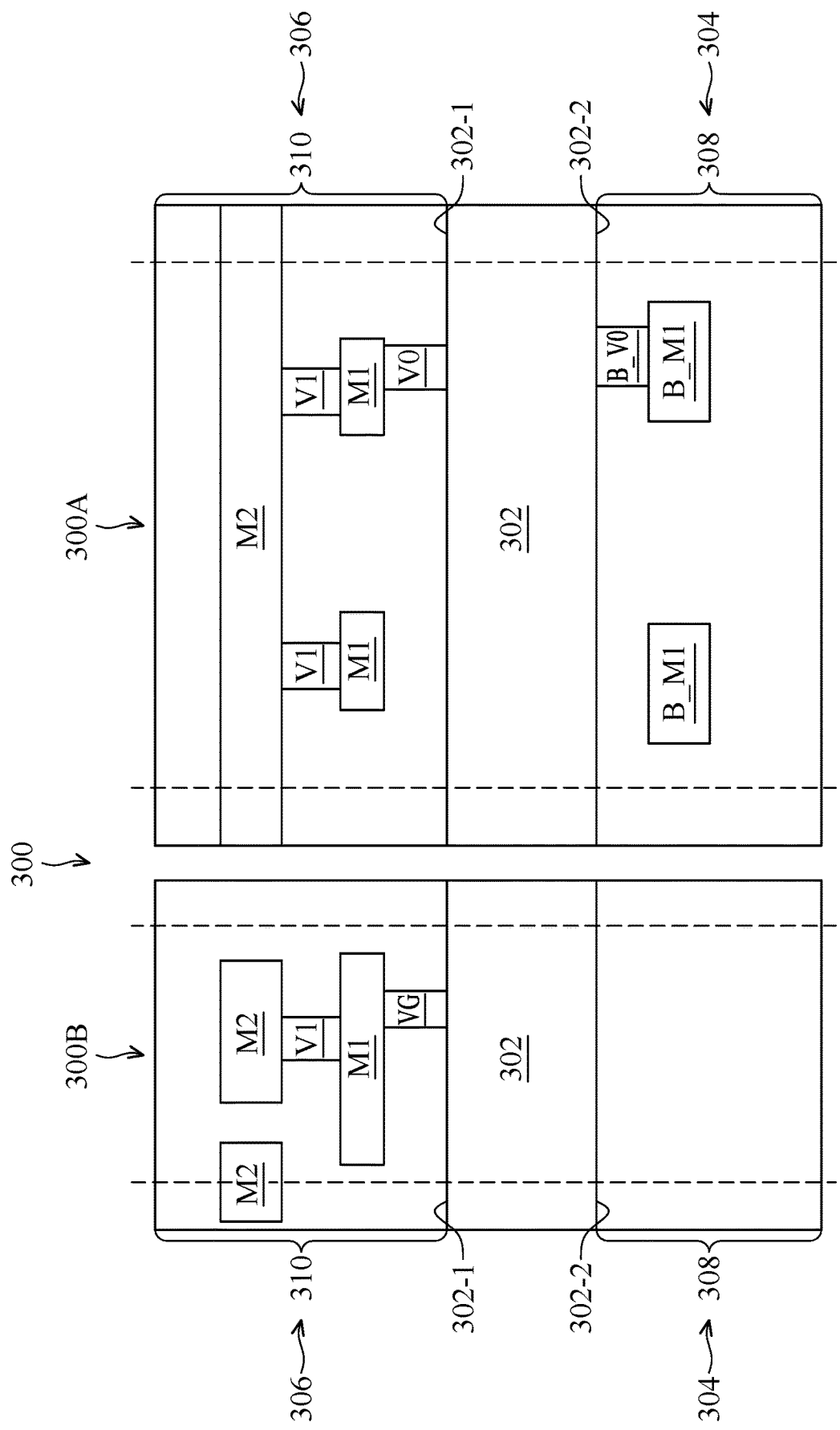
FIG. 6 shows a cross sectional view of a memory structure for illustrating front-side interconnection and back-side interconnection, in accordance with some embodiments of the present disclosure.

Generally, interconnection of devices and circuit cells are disposed over or at front-side of transistors to form desired circuit routing. As transistors and circuit cells continue to be scaled down, space for interconnection routing is also decreased. In order to achieve desired circuit routing, metal conductor width and conductor-to-conductor space are decreased, thereby increasing resistance and parasitic capacitance to impact performance of devices and circuit cells. In some embodiments of present disclosure, a part of interconnection of devices and circuit cells is disposed under or at back-side of transistors to improve upon the above issue. FIG. 6 shows a cross sectional view of a memory structure 300 for illustrating front-side interconnection and back-side interconnection, in accordance with some embodiments of the present disclosure. FIG. 6 also illustrates X-cut cross sectional view 300A and Y-cut cross sectional view 300B of the memory structure 300. The memory structure 300 has device region 302 (also referred to as a device layer), back-side interconnection structure 304, and front-side interconnection structure 306. The device region 302 is the region where the transistors and main features of SRAM cells (e.g., the SRAM cells 101A to 101K in FIGS. 7A to 18B) are located, such as gate structures, nanostructures, source/drain features, and contact features. The device region 302 has front-side 302-1 and back-side 302-2. The back-side interconnection structure 304 is under the device region 302 or at the back-side 302-2 of the device region 302, and the front-side interconnection structure 306 is over the device region 302 or at the front side 302-1 of the device region 302. The back-side interconnection structure 304 includes inter-metal dielectric (IMD) 308, a via B_V0, and metal conductors B_M1. The front-side interconnection structure 306 includes IMD 310, vias VG, V0, and V1, and metal conductors M1 and M2. The vias and metal conductors in the IMD 308 and 310 electrically couples various transistors and/or components (for example, gate structures, source/drain features, resistors, capacitors, and/or inductors) in the device region 302, such that the various devices and/or components can operate as specified by design requirements of circuit cells (e.g., logic cells and memory cells). It should be noted that there may be more vias and metal conductors in the IMD 308 and 310 for connections. The IMD 308 and 310 may be multilayer structure, such as one or more dielectric layers.

Since the back-side interconnection structure 304 is at the back-side 302-2 of the device region 302, the IMD 308, the via B_V0, and the metal conductors B_M1 may also be referred to as back-side IMD, back-side via, and back-side metal conductors, respectively. Since the front-side interconnection structure 306 is at the front-side 302-1 of the device region 302, the IMD 310, the vias VG, V0, and V1, and the metal conductors M1 and M2 may also be referred to as front-side IMD, front-side vias, and front-side metal conductors, respectively. In some embodiments, the via VG are connected to the gate structures (gate electrodes) of the transistors. Therefore, the via VG are also referred to as gate vias or front-side gate via.

The formation of the back-side interconnection structure 304 may include removing the substrate (if present) by CMP process, forming a back-side dielectric layer (not shown) under the device region 302 (or the back-side 302-2 of the device region 302), forming back-side contacts (not shown) connected to the source/drain features in the device region 302 in the back-side dielectric layer, forming a first dielectric layer of the IMD 308 under the back-side dielectric layer, forming back-side first level vias (e.g., the via B_V0) in the first dielectric layer, forming a second dielectric layer of the IMD 308 under the first dielectric layer, forming back-side first level metal conductors (e.g., the metal conductors B_M1) in the second dielectric layer, and forming protection layer (may be multiple layers and include dielectric layers, poly layers, or combination) under the fourth dielectric layer. The formation of the front-side interconnection structure 306 is similar to that of back-side interconnection structure 304, in which the difference is that the formation processes of the front-side interconnection structure 306 are performed at the front-side 302-1 of the device region 302, and may not be described in detail herein.

Figure 7A:
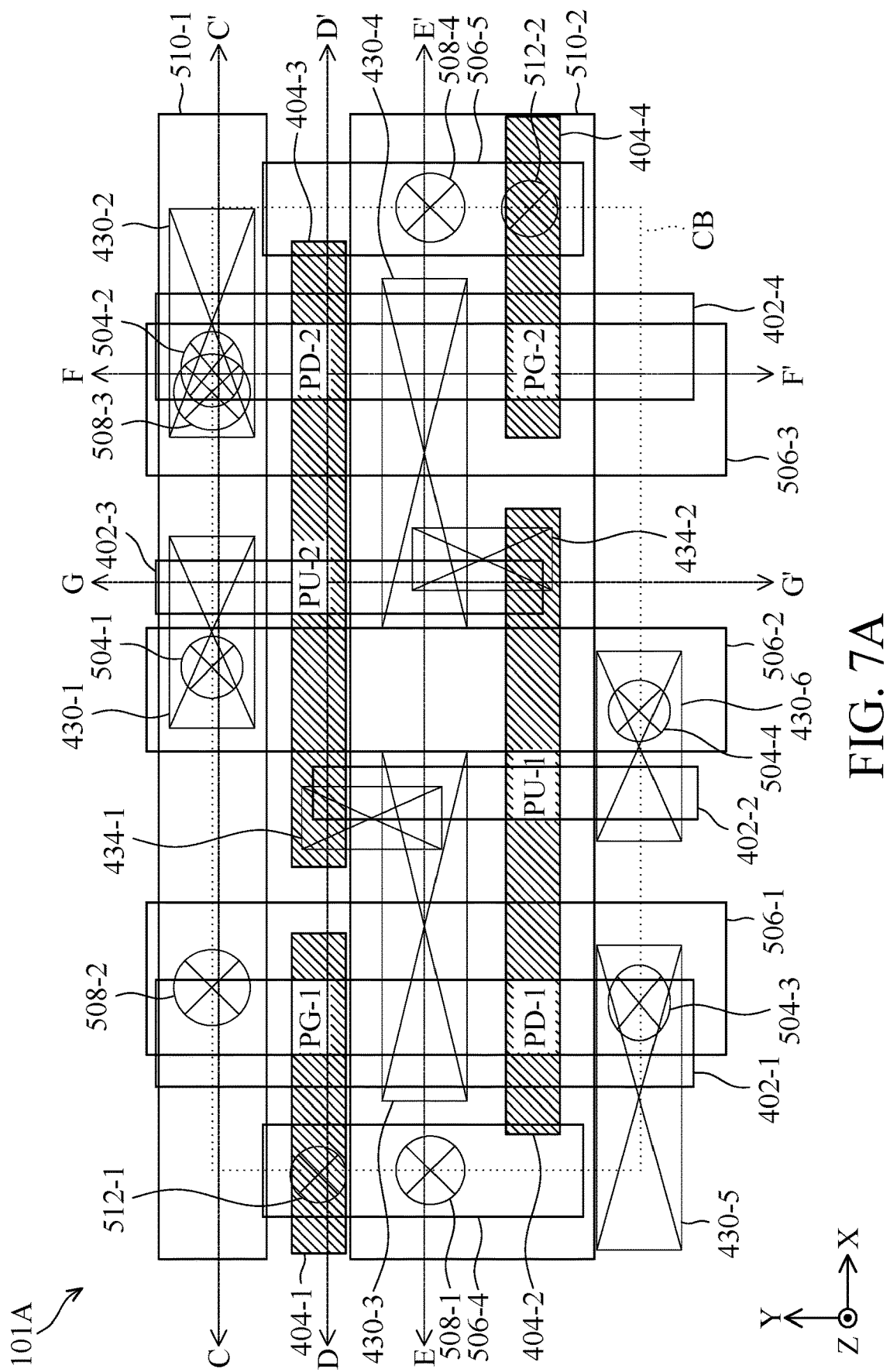
FIGS. 7A and 7B illustrate top views (or layouts) of an SRAM cell that can be one embodiment of the SRAM cells implemented in the array, in accordance with some embodiments of the present disclosure.
Figure 7B:
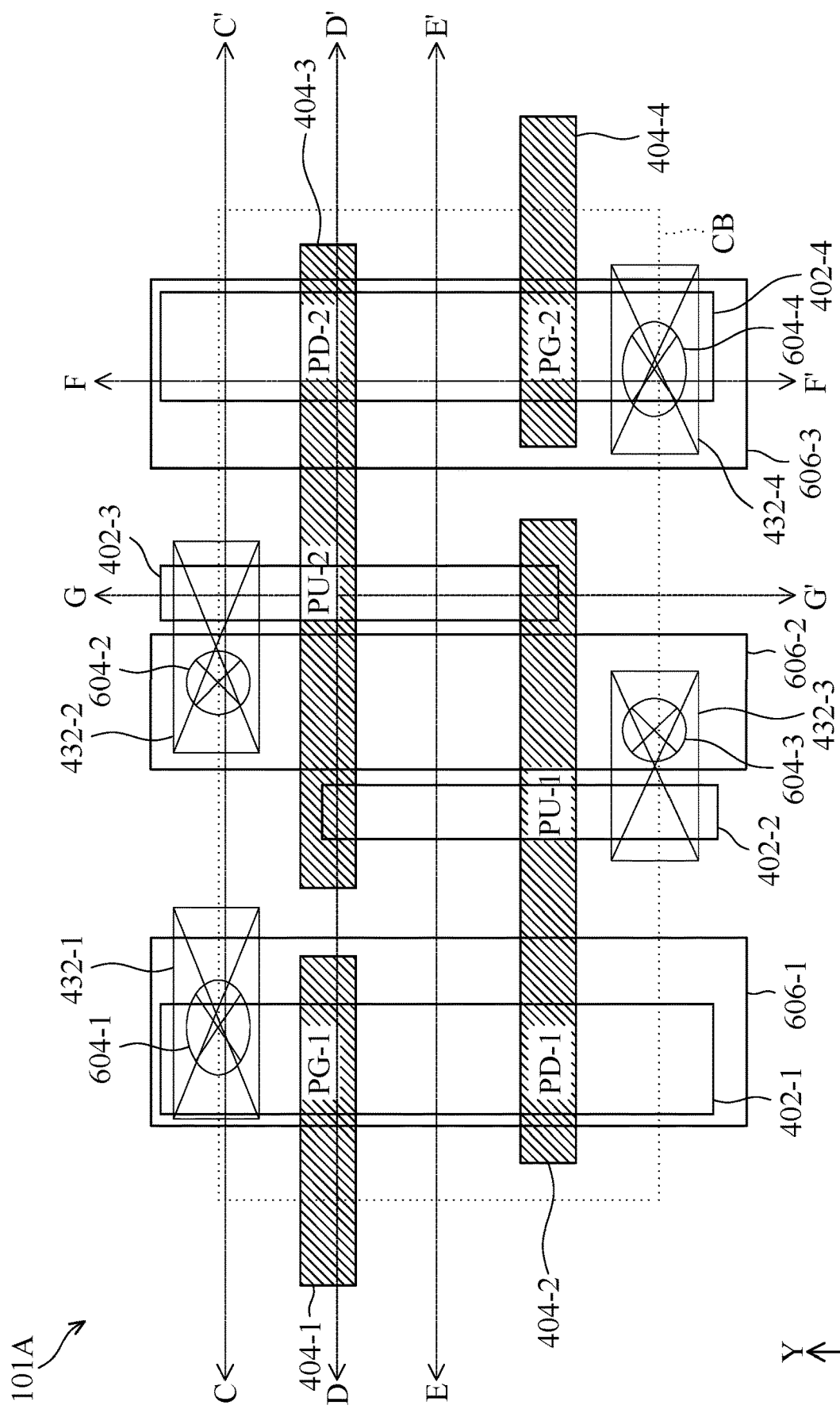

FIGS. 7A and 7B illustrate top views (or layouts) of an SRAM cell 101A that can be one embodiment of the SRAM cells 101 implemented in the array 100, in accordance with some embodiments of the present disclosure. FIG. 7A illustrates the features in the device region (including transistors) and the front-side interconnection structure (including vias and metal conductors), and FIG. 7B illustrates the features in the device region and the back-side interconnection structure.

Figure 7C:
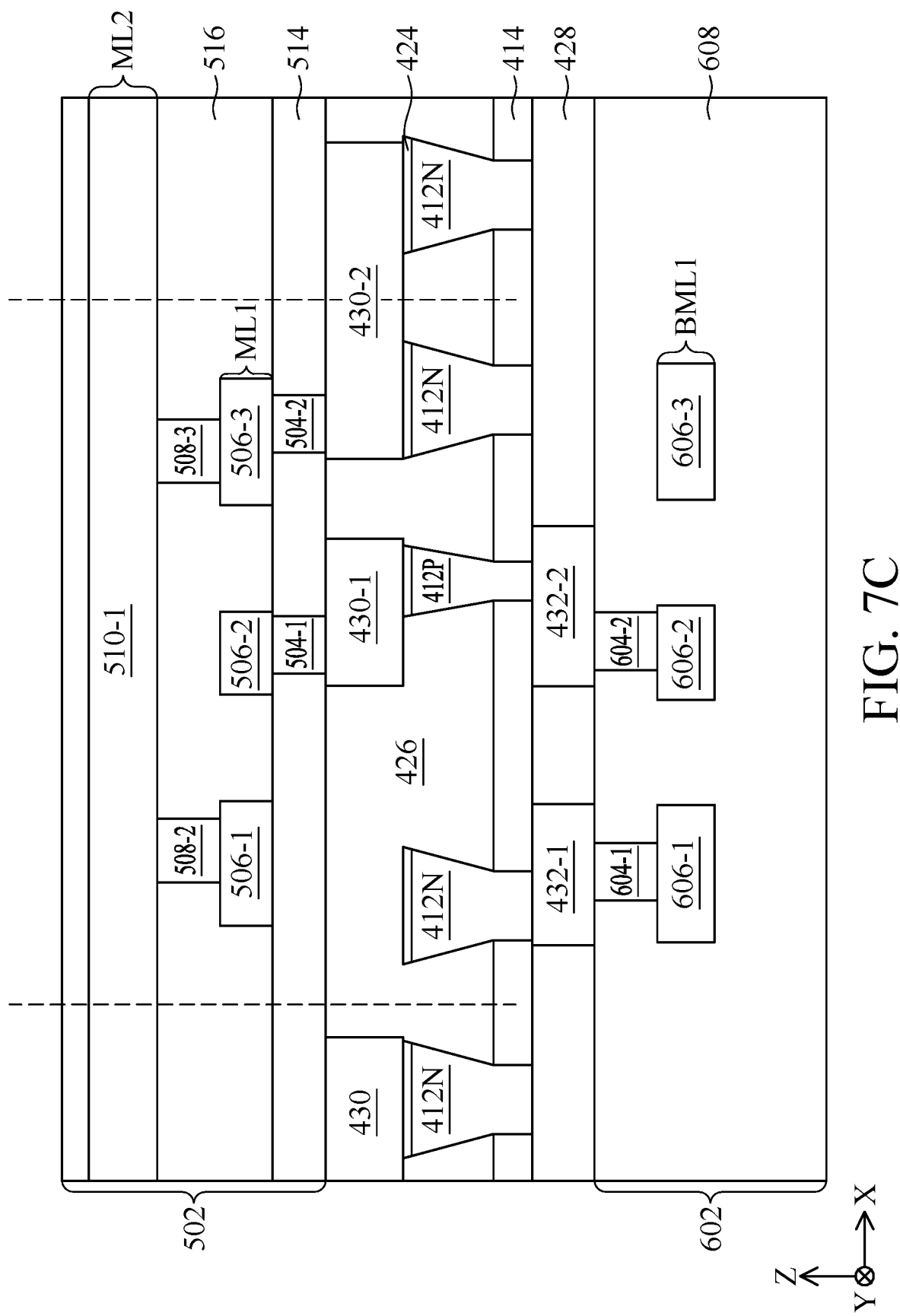
FIG. 7C illustrates a cross sectional view of the SRAM cell along a line C-C' in FIGS. 7A and 7B, in accordance with some embodiments of the present disclosure.
Figure 7D:
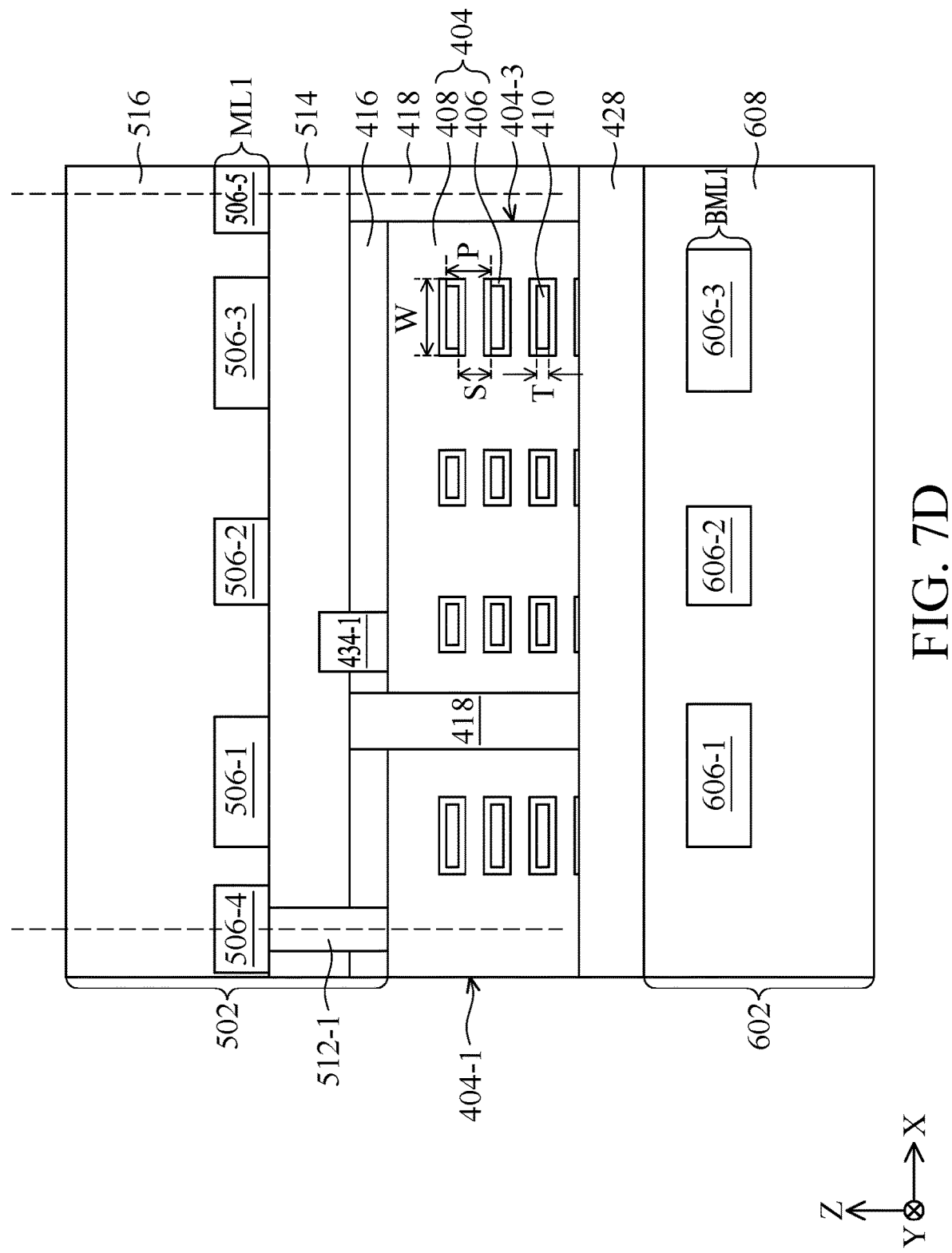
FIG. 7D illustrates a cross sectional view of the SRAM cell along a line D-D' in FIGS. 7A and 7B, in accordance with some embodiments of the present disclosure.
Figure 7E:
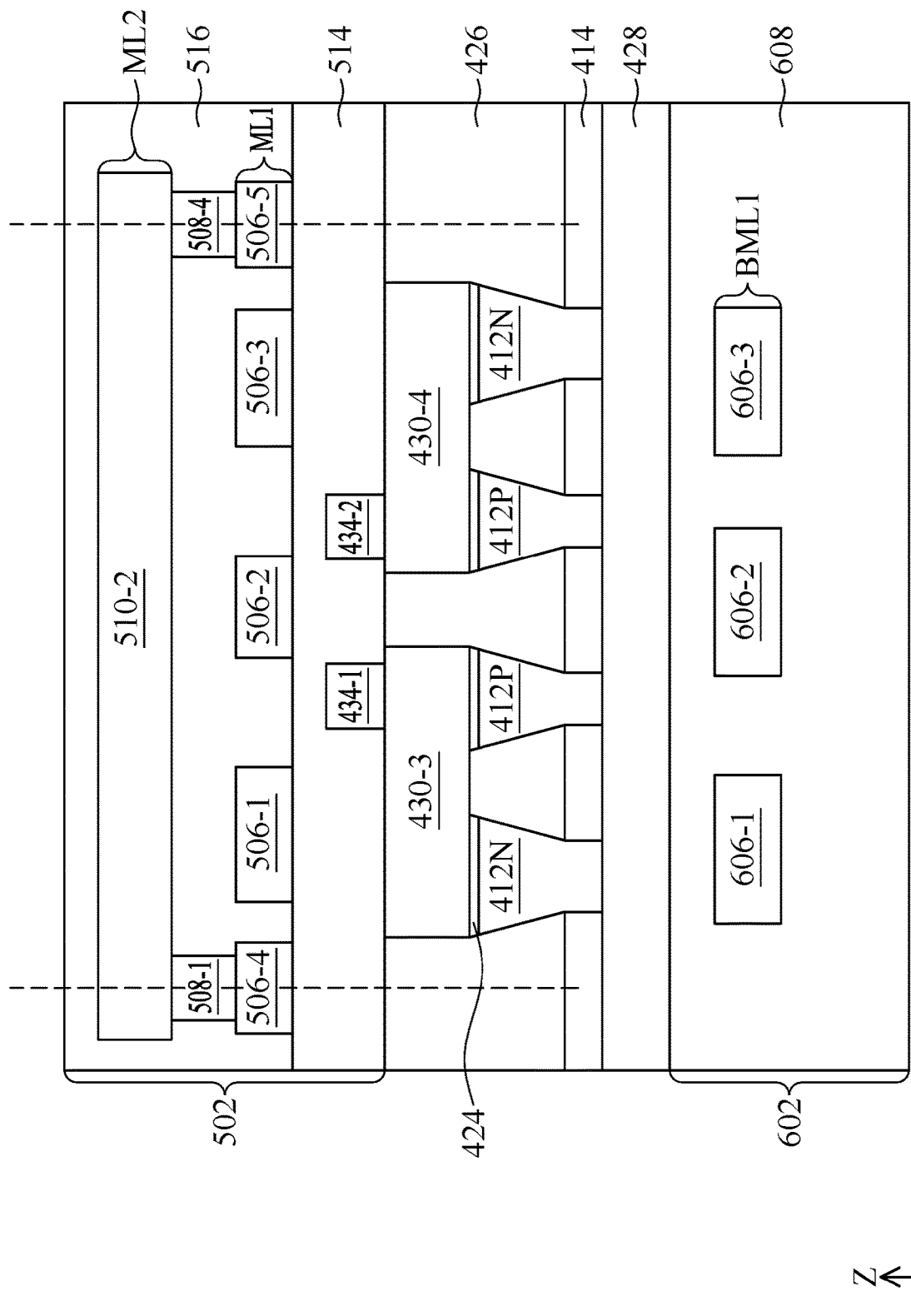
FIG. 7E illustrates a cross sectional view of the SRAM cell along a line E-E' in FIGS. 7A and 7B, in accordance with some embodiments of the present disclosure.
Figures 7F, 7G:
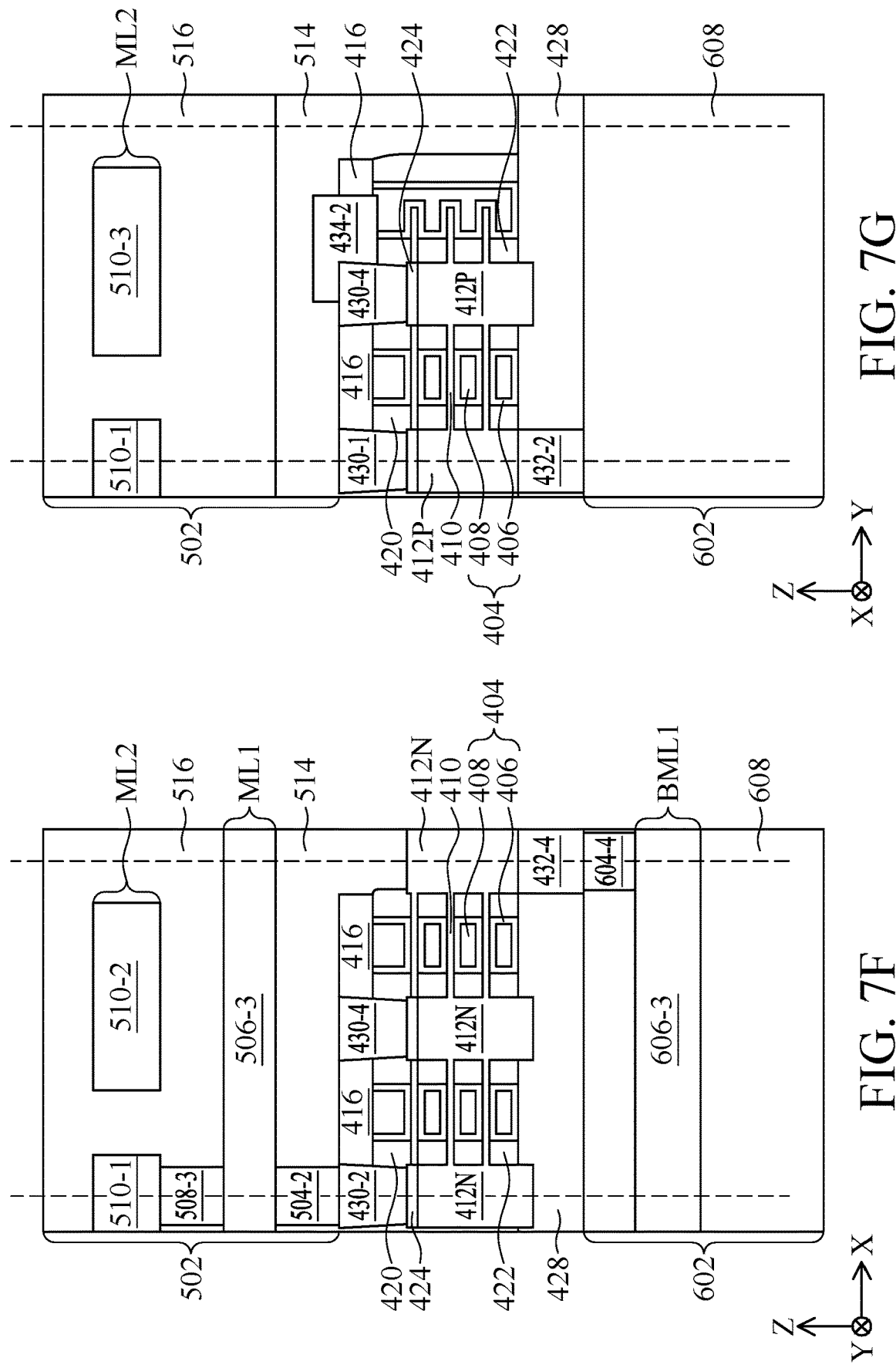
FIG. 7F illustrates a cross sectional view of the SRAM cell along a line F-F' in FIGS. 7A and 7B, in accordance with some embodiments of the present disclosure.
FIG. 7G illustrates a cross sectional view of the SRAM cell along a line G-G' in FIGS. 7A and 7B, in accordance with some embodiments of the present disclosure.

FIG. 7C illustrates a cross sectional view of the SRAM cell 101A along a line C-C' in FIGS. 7A and 7B, in accordance with some embodiments of the present disclosure. FIG. 7D illustrates a cross sectional view of the SRAM cell 101A along a line D-D' in FIGS. 7A and 7B, in accordance with some embodiments of the present disclosure. FIG. 7E illustrates a cross sectional view of the SRAM cell 101A along a line E-E' in FIGS. 7A and 7B, in accordance with some embodiments of the present disclosure. FIG. 7F illustrates a cross sectional view of the SRAM cell 101A along a line F-F' in FIGS. 7A and 7B, in accordance with some embodiments of the present disclosure. FIG. 7G illustrates a cross sectional view of the SRAM cell 101A along a line G-G' in FIGS. 7A and 7B, in accordance with some embodiments of the present disclosure.

As shown in FIGS. 7A and 7B, the SRAM cell 101A has a cell boundary CB indicated by the dotted rectangular box and constructed by two cell long boundaries in the X-direction and two cell short boundaries in the Y-direction. Such SRAM cells 101A are arranged in rows along the X-direction and in columns along the Y-direction. In that regard, the length of the cell long boundaries is also the pitch of the array of SRAM cells 101A along the X-direction, and the length of the cell short boundaries is also the pitch of the array of SRAM cells 101A along the Y-direction.

The SRAM cell 101A includes active areas, such as active areas 402-1 to 402-4, (may be collectively referred to as the active areas 402) that extend lengthwise in the Y-direction. Each of active areas 402 includes channel regions, source regions, and drain regions (where source regions and drain regions are collectively referred to as source/drain regions herein) of transistors. The SRAM cell 101A further includes gate structures, such as gate structures 404-1 to 404-4 (may be collectively referred to as the gate structures 404) that extend lengthwise in the X-direction perpendicular to the Y-direction. The gate structures 404-1 to 404-4 are disposed over the channel regions of the respective active areas 402-1 to 402-4 (i.e., (vertically stacked) nanostructures 410) and disposed between respective source/drain regions of the active areas 402-1 to 402-4 (i.e., source/drain features 412N and 412P). In some embodiments, the gate structures 404-1 to 404-4 wrap and/or surround suspended, vertically stacked nanostructures 410 in the channel regions of the active areas 402-1 to 402-4, respectively (as shown in FIGS. 7D, 7F, and 7G).

The gate structure 404-1 extends across the active area 402-1 in the top view and engages the active area 402-1 to form the pass-gate transistor PG-1; the gate structure 404-2 extends across the active areas 402-1 and 402-2 in the top view and engages the active area 402-1 and 402-2 to form the pull-down transistor PD-1 and the pull-up transistor PU-1 respectively; the gate structure 404-3 extends across the active areas 402-3 and 402-4 in the top view and engages the active area 402-3 and 402-4 to form the pull-up transistor PU-2 and the pull-down transistor PD-2 respectively; and the gate structure 404-4 extends across the active area 402-4 in the top view and engages the active area 402-4 to form the pass-gate transistor PG-2. Further, the pull-down transistor PD-1 and the pull-up transistor PU-1 share the gate structure 404-2, and the pull-down transistor PD-2 and the pull-up transistor PU-2 share the gate structure 404-3, so that the gate structure 404-2 and the gate structure 404-3 are also referred to as common gates or shared gate structures.

Similar to the isolation feature 218 discussed above, the SRAM cell 101A further includes an isolation feature (or isolation structure) 414. The isolation feature 414 may include silicon oxide, silicon nitride, silicon oxynitride, other suitable isolation material (for example, including silicon, oxygen, nitrogen, carbon, or other suitable isolation constituent), or combinations thereof. The isolation feature 414 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the SRAM cell 101A (e.g., the pass-gate transistors PG-1 and PG-2, the pull-down transistors PD-1 and PD-2, and the pull-up transistors PU-1 and PU-2) includes nanostructures 410 similar to the nanostructures 204 discussed above. As shown in FIGS. 7D, 7F, and 7G, the nanostructures 410 are suspended. In some embodiments, three nanostructures 410 are vertically stacked (or vertically arranged) from each other in the Z-direction for one transistor. However, there may be another appropriate number of nanostructures in one transistor. For example, there may be from 2 to 6 nanostructures 410 in one transistor. The nanostructures 410 further extend lengthwise in the Y-direction (FIGS. 7A, 7F, and 7G) and widthwise in the X-direction (FIGS. 7A and 7D). In some embodiments, each of the nanostructures 410 has a width W in the X-direction and in a range from about 4 nm to about 70 nm, as shown in FIG. 7D. In some embodiments, each of the nanostructures 410 has a thickness T in the Z-direction and in a range from about 4 nm to about 8 nm, as shown in FIG. 7D. As shown in FIG. 7D, in each of the transistors in the SRAM cell 101A, three nanostructures 410 are spaced from each other in the Z-direction by a distance S in a range from about 6 nm to about 15 nm. In some embodiments, the nanostructures 410 have vertically a pitch P in the Z-direction and in a range from about 10 nm to about 23 nm. The nanostructures 410 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 410 include silicon for n-type transistors. In other embodiments, the nanostructures 410 include silicon germanium for p-type transistors. In some embodiments, the nanostructures 410 are all made of silicon, and the type of the transistors depend on work function metal layer wrapping around the nanostructures 410. In some embodiments, the nanostructures 410 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

In some embodiments, each of the gate structures 404-1 to 404-4 has a gate length in the Y-direction and in a range from about 6 nm to about 20 nm. Each of the gate structures 404-1 to 404-4 has a gate dielectric layer 406 and a gate electrode layer 408. The gate dielectric layers 406 wrap around each of the nanostructures 410 and the gate electrodes layer 408 wrap around the gate dielectric layer 406. In some embodiments, the gate structures 404 each further includes an interfacial layer (such as having silicon dioxide, silicon oxynitride, or other suitable materials) between the gate dielectric layer 406 and the nanostructures 410. The gate dielectric layers 406 may include oxide with nitrogen doped dielectric material (initial layer) combined with metal content high-K dielectric material (K value (dielectric constant)>13). For example, gate dielectric layers 406 may include hafnium oxide ($HfO_2$), which has a dielectric constant in a range from about 18 to about 40. Alternatively, the gate dielectric layers 406 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The gate dielectric layers 406 may be formed by chemical oxidation, thermal oxidation, ALD, CVD, and/or other suitable methods.

The gate electrode layer 408 is formed to wrap around the gate dielectric layer 406 and the center portions of the nanostructures 410, as shown in FIGS. 7F and 7G. In some embodiments, the gate electrode layer 408 may include an n-type work function metal layer for n-type transistor or a p-type work function metal layer for p-type transistor. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

In some embodiments, the gate electrode layer 408 may include a single layer or alternatively a multi-layer structure. In some embodiments, the gate electrode layer 408 may further include a capping layer, a barrier layer, and a fill material (not shown). The capping layer may be formed adjacent to the gate dielectric layers 406 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The SRAM cell 101A further includes gate top dielectric layers 416 are over the gate dielectric layers 406, the gate electrodes 408, and the nanostructures 410. The gate top dielectric layers 416 are similar to the gate top dielectric layer 214 discussed above. The gate top dielectric layer 416 is used for contact etch protection layer.

In some embodiments, the gate top dielectric layer 416 has a thickness in a range from about 2 nm to about 60 nm. The material of gate top dielectric layer 416 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($A_{12}O_3$), Y oxide ($Y_2O_3$), combinations thereof, or other suitable material.

As shown in FIG. 7D, gate end dielectrics 418 are at ends of the gate structures 404. The gate end dielectrics 418 are used for separating the gate structures 404 aligned in the –direction. For example, the gate end dielectrics 320 separate the gate structures 404-1 and 404-3, as shown in FIG. 7D. The material of the gate end dielectrics 418 is selected from a group consisting of $Si_3N_4$, nitride-base dielectric, carbon-base dielectric, high K material (K>=9), or a combination thereof.

The SRAM cell 101A further includes gate spacers 420 are on sidewalls of the gate structures 404 and over the nanostructures 410, as shown in FIGS. 7F and 7G. More specifically, the gate spacers 420 are over the nanostructures 410 and on top sidewalls of the gate structures 404, and thus are also referred to as gate top spacers or top spacers. The gate spacers 420 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 420 may include a single layer or a multi-layer structure.

As shown in FIGS. 7F and 7G, the SRAM cell 101A further includes inner spacers 422 on the sidewalls of the gate structures 404 and below the topmost nanostructures 410. Furthermore, the inner spacers 422 are laterally between the source/drain features 412N (or 412P) and the gate structures 404. The inner spacers 422 are also vertically between adjacent nanostructures 410. The inner spacers 422 may include a dielectric material having higher K value (dielectric constant) than the gate spacers 420 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the gate spacers 420 and the inner spacers 422 have a thickness in the Y-direction and in a range from about 4 nm to about 12 nm. In some embodiments, the thickness of the gate spacers 420 in the Y-direction and the thickness of the inner spacers 422 in the Y-direction are the same. In other embodiments, the thickness of the gate spacers 420 in the Y-direction is less than the thickness of the inner spacers 422 in the Y-direction due to the gate spacers 420 are trimmed during sequent processes for forming source/drain contacts.

Referring to FIGS. 7C and 7E to 7G, the SRAM cell 101A further includes source/drain features 412N and source/drain features 412P in the source/drain regions of the active areas 402. The source/drain features 412N are disposed over both sides of the respective gate structure 404 and connected by the nanostructures 410 to form n-type transistor (e.g., the pass-gate transistors PG-1 and PG-2, the pull-down transistors PD-1 and PD-2). Similarly, the source/drain features 412P are disposed over both sides of the respective gate structure 404 and connected by the nanostructures 410 to form p-type transistor (e.g., the pull-up transistors PU-1 and PU-2).

The source/drain features 412N and 412P may be formed by using epitaxial growth. In some embodiments, the source/drain features 412N may include epitaxially-grown material selected from a group consisting of SiP, SiC, SiPC, SiAs, Si, or a combination thereof. In some embodiments, the epitaxially-grown material of the source/drain features 412N may be doped with phosphorus (or arsenic, or both) having a doping concentration in a range from about $2\times10^{19}/cm^3$ to $3\times10^{21}/cm^3$. In some embodiments, the source/drain features 412P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 412P may be doped with boron having a doping concentration in a range from about $1\times10^{19}/cm^3$ to $6\times10^{20}/cm^3$.

As shown in FIGS. 7C and 7E to 7G, the SRAM cell 101A further includes silicide features 424 over the source/drain features 412N and 412P. The silicide features 424 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 7A to 7C and 7E to 7G, the SRAM cell 101A further includes source/drain contacts 430 (including source/drain contacts 430-1 to 430-6) in an inter-layer dielectric (ILD) layer 426 and source/drain contacts 432 (including source/drain contacts 432-1 to 432-4) in a dielectric layer 428. As shown in FIG. 7A, the source/drain contacts 430 and 432 extend lengthwise in the X-direction. The source/drain contacts 430 are self-aligned source/drain contacts. This means that the source/drain contacts 430 are formed by using the gate spacers 420 as mask. Therefore, the source/drain contacts 430 are in direct contact with the gate spacers 420, as shown in FIGS. 7F and 7G. In some embodiments, the gate spacers 420 are trimmed due to the gate spacers 420 serving as the mask for forming the source/drain contacts 430. Therefore, the thickness of the gate spacers 420 in the Y-direction is less than the thickness of the inner spacers 422 in the Y-direction, as discussed above.

Furthermore, each of the source/drain contacts 430 is over and electrically connected to the respective source/drain features 412N/412P and each of the source/drain contacts 432 is under electrically connected to the respective source/drain features 412N/412P. Specifically, as shown in FIGS. 7A, the source/drain contact 430-1 is over and electrically connected to the source/drain feature 412P of the pull-up transistor PU-2; the source/drain contact 430-2 is over and electrically connected to the source/drain feature 412N of the pull-down transistor PD-2; the source/drain contact 430-3 is over and electrically connected to the source/drain feature 412N of the pass-gate transistor PG-1 and pull-down transistor PD-1 (also referred to as common source/drain or common drain) and the source/drain feature 412P of the pull-up transistor PU-1; the source/drain contact 430-4 is over and electrically connected to the source/drain feature 412N of the pass-gate transistor PG-2 and pull-down transistor PD-2 (also referred to as common source/drain or common drain) and the source/drain feature 412P of the pull-up transistor PU-2; the source/drain contact 430-5 is over and electrically connected to the source/drain feature 412N of the pull-down transistor PD-1; and the source/drain contact 430-6 is over and electrically connected to the source/drain feature 412P of the pull-up transistor PU-1. As shown in FIG. 7B, the source/drain contact 432-1 is under and electrically connected to the source/drain feature 412N of the pass-gate transistor PG-1; the source/drain contact 432-2 is under and electrically connected to the source/drain feature 412P of the pull-up transistor PU-2; the source/drain contact 432-3 is under and electrically connected to the source/drain feature 412P of the pull-up transistor PU-1; and the source/drain contact 432-4 is under and electrically connected to the source/drain feature 412N of the pass-gate transistor PG-2. In some embodiments, the source/drain contacts 430 may be referred to as front-side source/drain contacts due to the source/drain contacts 430 are over the source/drain features 412N/412P. In some embodiments, the source/drain contacts 432 may be referred to as back-side source/drain contacts due to the source/drain contacts 432 are under the source/drain features 412N/412P.

The SRAM cell 101A further includes butted contacts 434-1 and 434-2. As shown in FIG. 7A, the butted contact 434-1 is over the source/drain contact 430-3 and the gate structure 404-3, and the butted contact 434-2 is over the source/drain contact 430-4 and the gate structure 404-2. In some embodiments, the butted contact 434-1 electrically connects the source/drain contact 430-3 to the gate structure 404-3 and the butted contact 434-2 electrically connects the source/drain contact 430-4 to the gate structure 404-2. The butted contacts 434-1 and the source/drain contact 430-3 may correspond to the storage node SN shown in FIG. 2 and the butted contacts 434-2 and the source/drain contact 430-4 may correspond to the storage node SNB shown in FIG. 2. The source/drain contacts 430 and 432 and butted contacts 434-1 and 434-2 may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 430 and 432 and butted contacts 434-1 and 434-2 may each include single conductive material layer or multiple conductive layers.

As discussed above, the front-side interconnection structure is over the device region or at the front-side of the device region. The SRAM cell 101A further includes a front-side interconnection structure 502 including vias 504 (including vias 504-1 to 504-4), metal conductors 506 (including metal conductors 506-1 to 506-5), vias 508 (including vias 508-1 to 508-4), metal conductors 510 (including metal conductors 510-1 and 510-2), gate vias 512 (including gate vias 512-1 and 512-2), an ILD layer 514, and an IMD layer 516, which are over (or at the front-side of) the transistors in the SRAM cell 101A (e.g., the pass-gate transistors PG-1 and PG-2, the pull-down transistors PD-1 and PD-2, and the pull-up transistors PU-1 and PU-2).

The metal conductors 506 are in a (front-side) metal layer ML1 in the IMD layer 516 and extend lengthwise in the Y-direction. The metal conductors 510 are in a (front-side) metal layer ML2 in the IMD layer 516 and extend lengthwise in the X-direction. The metal layer ML1 is over the SRAM cell 101A and the metal layer ML2 is over the metal layer ML1, and thus the metal conductors 506 are over the transistors of the SRAM cell 101A and the metal conductors 510 are over the metal conductors 506. Each of the vias 504 in the ILD layer 514 are vertically between and electrically connected to the respective source/drain contact 430 and the respective metal conductor 506. Each of the gate vias 512 in the ILD layer 514 are vertically between and electrically connected to the respective gate structure 404 and the respective metal conductor 506. Each of the vias 508 in the IMD layer 516 are vertically between and electrically connected to the respective metal conductor 506 and the respective metal conductor 510. In some embodiments, the vias 504, the vias 508, and the gate vias 512 may have circular shape in the top view. In other embodiments, the vias 504, the vias 508, and the gate vias 512 may have a rectangular shape in the top view.

The vias 504, the metal conductors 506, the vias 508, the metal conductors 510, and the gate vias 512 may be respectively similar to the via V0, the metal conductors M1, the vias V1, the metal conductors M2, and the via VG discussed above. The vias 504 and 508, the gate vias 512, the metal conductors 506 and 510, the ILD layer 514, and IMD layer 516 may also be referred to as front-side vias, front-side gate vias, front-side metal conductors, front-side ILD layer, and front-side IMD layer, respectively.

In some embodiments, the metal conductor 510-2 serves as the word-line that is electrically connected to a controller (e.g., the controller 103 discussed above) and electrically connected to the gate structures (more specifically, the gate electrodes) of the pass-gate transistors in the same row of the array of the SRAM cell. As shown in FIGS. 7A to 7E, in the SRAM cell 101A, the metal conductor 510-2 is over the pass-gate transistor PG-1 and PG-2. The metal conductor 510-2 is electrically connected to the gate structure 404-1 of the pass-gate transistor PG-1 through the via 508-1, the metal conductor 506-4, and the gate via 512-1, and is electrically connected to the gate structure 404-4 of the pass-gate transistor PG-2 through the via 508-4, the metal conductor 506-5, and the gate via 512-2. In some embodiments, the metal conductor 510-2 may be referred to as (front-side) word-line conductor. In some embodiments, the metal conductors 506-4 and 506-5 may be referred to as word-line landing pads.

In some embodiments, the metal conductors 506-1 and 506-3 serve as the VSS lines that are electrically coupled to a voltage node or voltage source (not shown) (e.g., the voltage node (or voltage source) VSS discussed above) and electrically connected to the source/drain features of the pull-down transistors in the same column of the array of the SRAM cell. As shown in FIGS. 7A to 7E, in the SRAM cell 101A, the metal conductor 506-1 and 506-3 are respectively over the pull-down transistor PD-1 and PD-2. The metal conductor 506-1 is electrically connected to the source/drain features 412N of the pull-down transistor PD-1 through the via 504-3 and the source/drain contact 430-5; and the metal conductor 506-3 is electrically connected to the source/drain features 412N of the pull-down transistor PD-2 through the via 504-2 and the source/drain contact 430-2. In some embodiments, the metal conductors 506-1 and 506-3 may be referred to as (front-side) VSS conductors or (front-side) VSS lines.

As discussed above, the metal conductors 506-1 and 506-3 are electrically coupled to the voltage node (or voltage source) VSS. The metal conductor 510-1 is electrically connected to the metal conductors 506-1 and 506-3 to serve as a power mesh line for connecting the voltage node VSS to the metal conductors 506-1 and 506-3. As shown in FIGS. 7A to 7E, in the SRAM cell 101A, the metal conductor 510-1 is electrically connected to the metal conductor 506-1 through the via 508-2 and electrically connected to the metal conductor 506-3 through the via 508-3. In some embodiments, the metal conductor 510-1 may be referred to as a (front-side) VSS power mesh line or a VSS power mesh conductor.

In some embodiments, the metal conductor 506-2 serves as the VDD line that is electrically coupled to a voltage node or voltage source (not shown) (e.g., the voltage node (or voltage source) VDD discussed above) and electrically connected to the source/drain features of the pull-up transistors in the same column of the array of the SRAM cell. As shown in FIGS. 7A to 7E, in the SRAM cell 101A, the metal conductor 506-2 is over the pull-up transistor PU-1 and PU-2. The metal conductor 506-2 is electrically connected to the source/drain features 412P of the pull-up transistor PU-1 through the via 504-4 and the source/drain contact 430-6, and is electrically connected to the source/drain features 412P of the pull-up transistor PU-2 through the via 504-1 and the source/drain contact 430-1. In some embodiments, the metal conductor 506-2 may be referred to as the (front-side) VDD conductors or the (front-side) VDD lines.

As discussed above, the back-side interconnection structure is under the device region or at the back-side of the device region. The SRAM cell 101A further includes a back-side interconnection structure 602 including vias 604 (including vias 604-1 to 604-4), metal conductors 606 (including metal conductors 606-1 to 606-3), and an IMD layer 608, which are under (or at the back-side of) the transistors in the SRAM cell 101A (e.g., the pass-gate transistors PG-1 and PG-2, the pull-down transistors PD-1 and PD-2, and the pull-up transistors PU-1 and PU-2).

The metal conductors 606 are in a (back-side) metal layer BML1 in the IMD layer 608 and extend lengthwise in the Y-direction. The metal layer BML1 is under the SRAM cell 101A, and thus the metal conductors 606 are under the transistors of the SRAM cell 101A. Each of the vias 604 in the IMD layer 608 are vertically between and electrically connected to the respective source/drain contact 432 and the respective metal conductor 606. In some embodiments, the vias 604 may have circular shape in the top view. In other embodiments, the vias 604 may have a rectangular shape in the top view.

The vias 604 and the metal conductors 606 may be respectively similar to the via B_V0 and the metal conductors B_M1 discussed above. The vias 604, the metal conductors 606, and IMD layer 608 may also be referred to as back-side vias, back-side metal conductors, and back-side IMD layer, respectively In some embodiments, the metal conductors 606-1 and 606-3 respectively serve as the bit-line and the bit-line-bar that are electrically connected to a controller (e.g., the controller 102 discussed above) and electrically connected to the source/drain features of the pass-gate transistors in the same column of the array of the SRAM cell. As shown in FIGS. 7A to 7E, in the SRAM cell 101A, the metal conductor 606-1 and 606-3 are respectively under the pass-gate transistor PG-1 and PG-2. The metal conductor 606-1 is electrically connected to the source/drain feature 412N of the pass-gate transistor PG-1 through the via 604-1 and the source/drain contact 432-1, and the metal conductor 606-3 is electrically connected to the source/drain feature 412N of the pass-gate transistor PG-2 through the via 604-4 and the source/drain contact 432-4. In some embodiments, the metal conductors 606-1 and 606-3 may be respectively referred to as (back-side) bit-line conductor and (back-side) bit-line-bar conductor.

In some embodiments, the metal conductor 606-2 also serves as the VDD line that is electrically coupled to a voltage node or voltage source (not shown) (e.g., the voltage node (or voltage source) VDD discussed above) and electrically connected to the source/drain features of the pull-up transistors in the same column of the array of the SRAM cell. As shown in FIGS. 7A to 7E, in the SRAM cell 101A, the metal conductor 606-2 is under the pull-up transistor PU-1 and PU-2. The metal conductor 606-2 is electrically connected to the source/drain features 412P of the pull-up transistor PU-1 through the via 604-3 and the source/drain contact 432-3, and is electrically connected to the source/drain features 412P of the pull-up transistor PU-2 through the via 604-2 and the source/drain contact 432-2. In some embodiments, the metal conductor 606-2 may also be referred to as (back-side) VDD conductors or (back-side) VDD lines.

The ILD layer 426, the dielectric 428, the ILD layer 514, the IMD 516, and the IMD 608 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The materials of the vias 504, the metal conductors 506, the vias 508, the metal conductors 510, the gate vias 512, the vias 604, and the metal conductors 606 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIGS. 7A to 7E, the metal conductors 606-1 and 606-3 (serving as the bit-line and the bit-line-bar) are disposed at the back-side of the SRAM cell 101A, so that the crowded space at the front-side interconnection structure in existing technologies are relieved to reduce the routing complexity of the SRAM cells. Furthermore, the metal conductor 510-2 (serving as the word-line) and the metal conductors 606-1 and 606-3 (serving as the bit-line and the bit-line-bar) may be designed with wider width, so that reducing the circuit resistance. The conductor-to-conductor space between the metal conductors may also be increased to reduce parasitic capacitance. Furthermore, in a cross sectional view of the SRAM cell 101A, such as FIGS. 7F and 7G, it should be noted that the source/drain contacts 432 are not surrounded by the gate structures 404 in the Y-direction. This means that the current from the back-side conductors, such as the metal conductors 606-1 and 606-3 (which serve as the bit-line and the bit-line-bar) is not affected by the gate structures 404 during operation of the SRAM cell 101A when passing through the source/drain contacts 432. As such, the reliability of the read/write operations of the SRAM cell 101A are improved. Therefore, the performance of the SRAM cell 101A are improved.

As discussed above, referring back to FIG. 2, the metal conductors disposed under the SRAM cells may also be routed to the front-side conductors over the SRAM cells through the tap structures 2000 located in the edge strap regions and the edge cell regions. The metal conductors 606-1 and 606-3 in the SRAM cell 101A (serving as the bit-line and the bit-line-bar) may extend in the Y-direction to the edge strap regions of the array constructed by the SRAM cells 101A, and then may be routed to the front-side conductors through the tap structures (e.g., the tap structures 2000).

Figure 8:
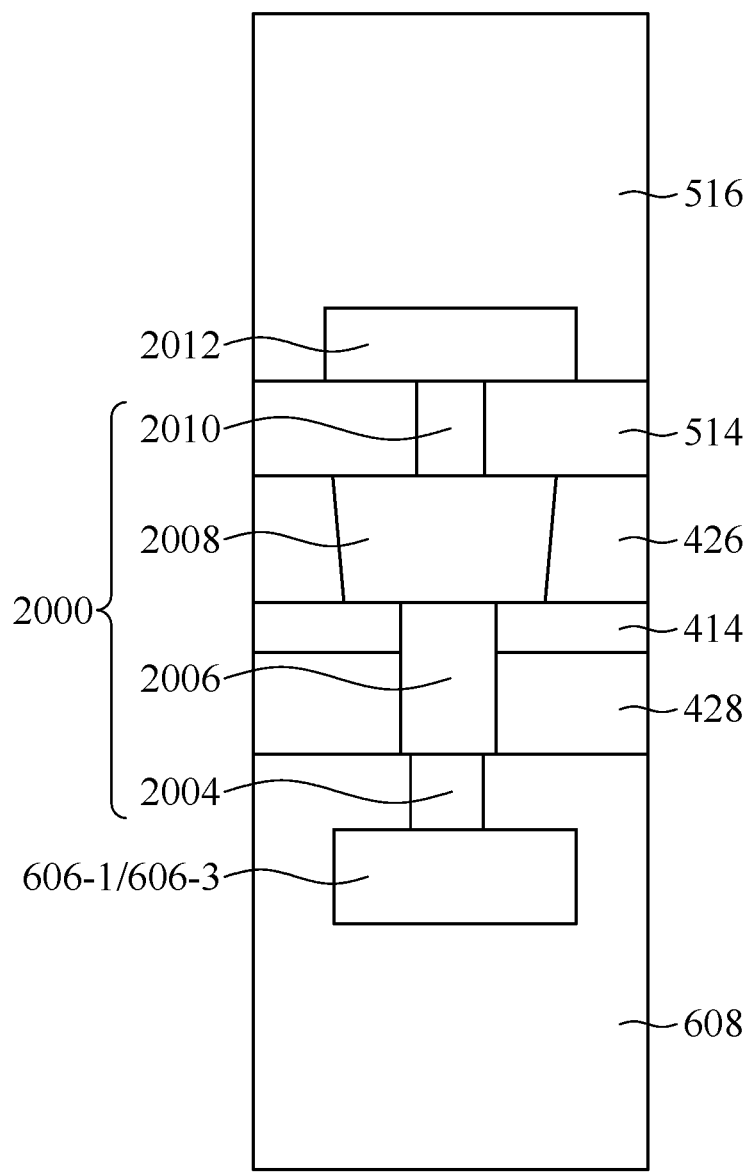
FIG. 8 illustrates a cross sectional view of tap structures in FIG. 2 for connecting the metal conductor at the back-side to a front-side metal conductor at the front-side, in accordance with some embodiments of the present disclosure.

FIG. 8 illustrates a cross sectional view of tap structures 2000 in FIG. 2 for connecting the metal conductor 606-1 or 606-3 at the back-side to a front-side metal conductor at the front-side, in accordance with some embodiments of the present disclosure. As shown in FIG. 8, a tap structure 2000 may electrically connect the metal conductor 606-1 or 606-3 to a front-side bit-line conductor 2012 electrically connected to the controller (e.g., the controller 102). The tap structure 1016 may include a via 2004, a tap via 2006, a contact feature 2008, a via 2010. The via 2004 is at the back-side of the device region discussed above, and the via 2010 and the contact feature 2008 are at the front-side of the device region. In some embodiments, the via 2004 and the vias 604 are formed at the same fabrication operation, the contact feature 2008 and the source/drain contacts 430 are formed at the same fabrication operation, and the via 2010 and the via 504 are formed at the same fabrication operation. In some embodiments, the tap via 2006 is formed after the formation of the gate vias 512. Such tap structure 2000 for the metal conductor 606-1 or 606-3 served as bit-line or bit-line-bar may be referred to as bit-line tap structure or bit-line-bar tap structure. It should be noted that the tap structure 2000 may be applied for connecting any back-side metal conductor to a front-side metal conductor. It should be noted that the tap structure 2000 may have more vias and more metal conductors.

Figure 9A:
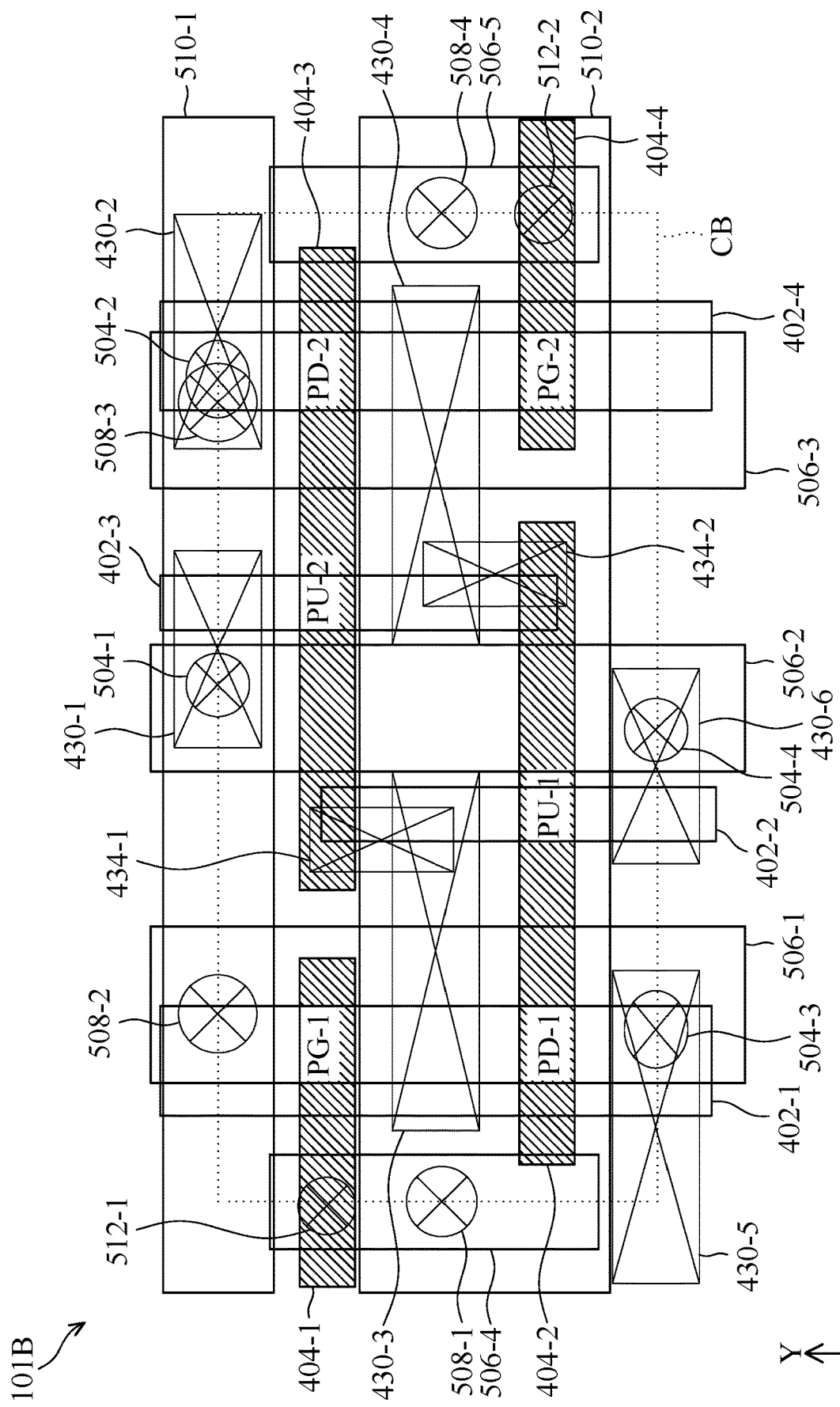
FIGS. 9A and 9B illustrate top views (or layouts) of an SRAM cell that can be one embodiment of the SRAM cells implemented in the array, in accordance with some embodiments of the present disclosure.
Figure 9B:
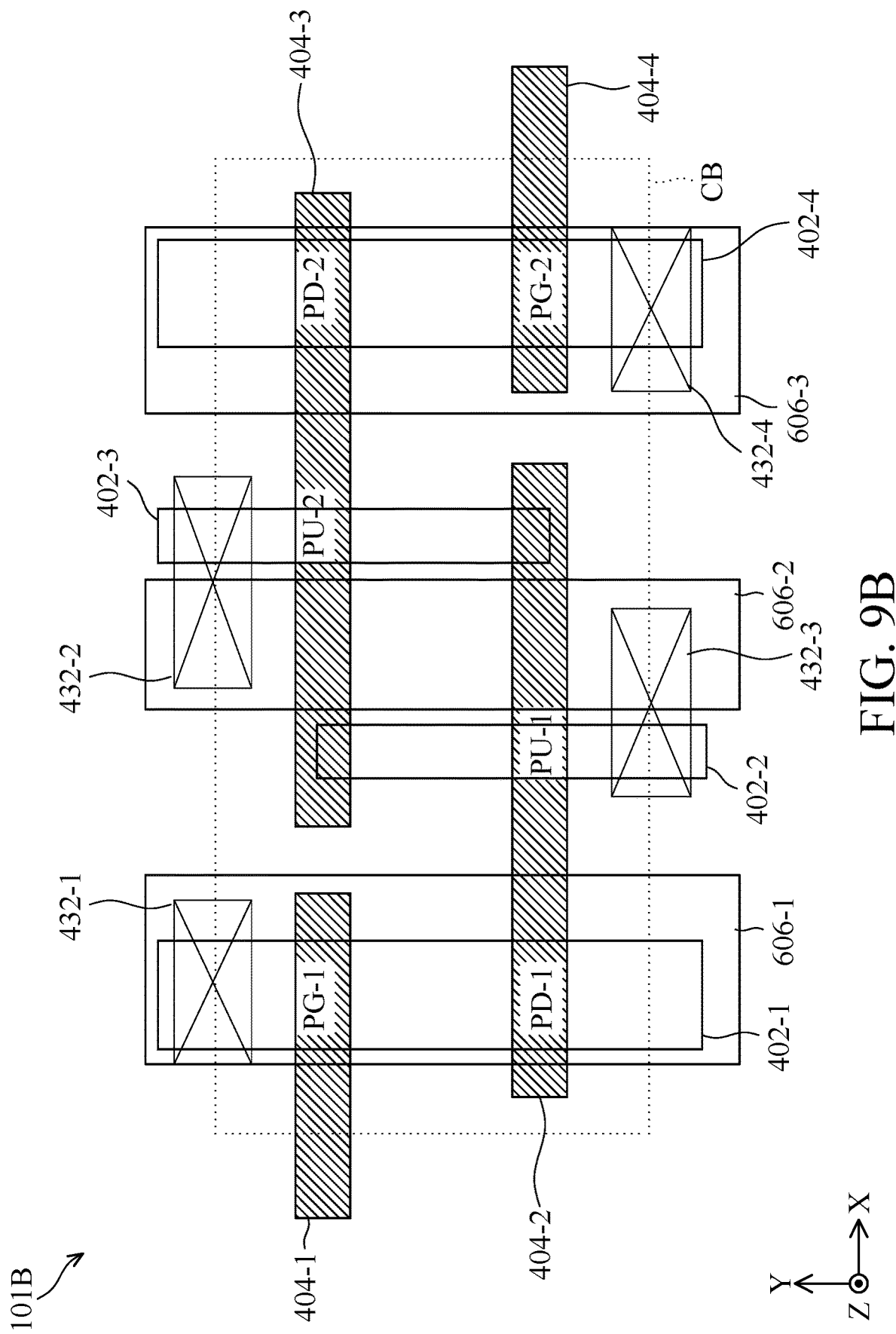

FIGS. 9A and 9B illustrate top views (or layouts) of an SRAM cell 101B that can be one embodiment of the SRAM cells 101 implemented in the array 100, in accordance with some embodiments of the present disclosure. FIG. 9A illustrates the features in the device region (including transistors) and the front-side interconnection structure (including vias and metal conductors), and FIG. 9B illustrates the features in the device region and the back-side interconnection structure.

The SRAM cell 101B is similar to the SRAM cell 101A discussed above, except that no back-side vias are formed. The vias 432 shown in the SRAM cell 101A are not formed in the SRAM cell 101B. As shown in FIGS. 9A and 9B, the metal conductors 606-1 to 606-3 are in contact with the source/drain contacts 432. As such, the metal conductor 606-1 is electrically connected to the source/drain feature 412N of the pass-gate transistor PG-1 through the source/drain contact 432-1; the metal conductor 606-2 is electrically connected to the source/drain features 412P of the pull-up transistor PU-1 through the source/drain contact 432-3, and is electrically connected to the source/drain features 412P of the pull-up transistor PU-2 through the source/drain contact 432-2; and the metal conductor 606-3 is electrically connected to the source/drain feature 412N of the pass-gate transistor PG-2 through the source/drain contact 432-4. In this embodiment, the cost of forming the vias 432 can be saved and the resistance of the back-side interconnection structure 602 can be reduced.

Figure 10A:
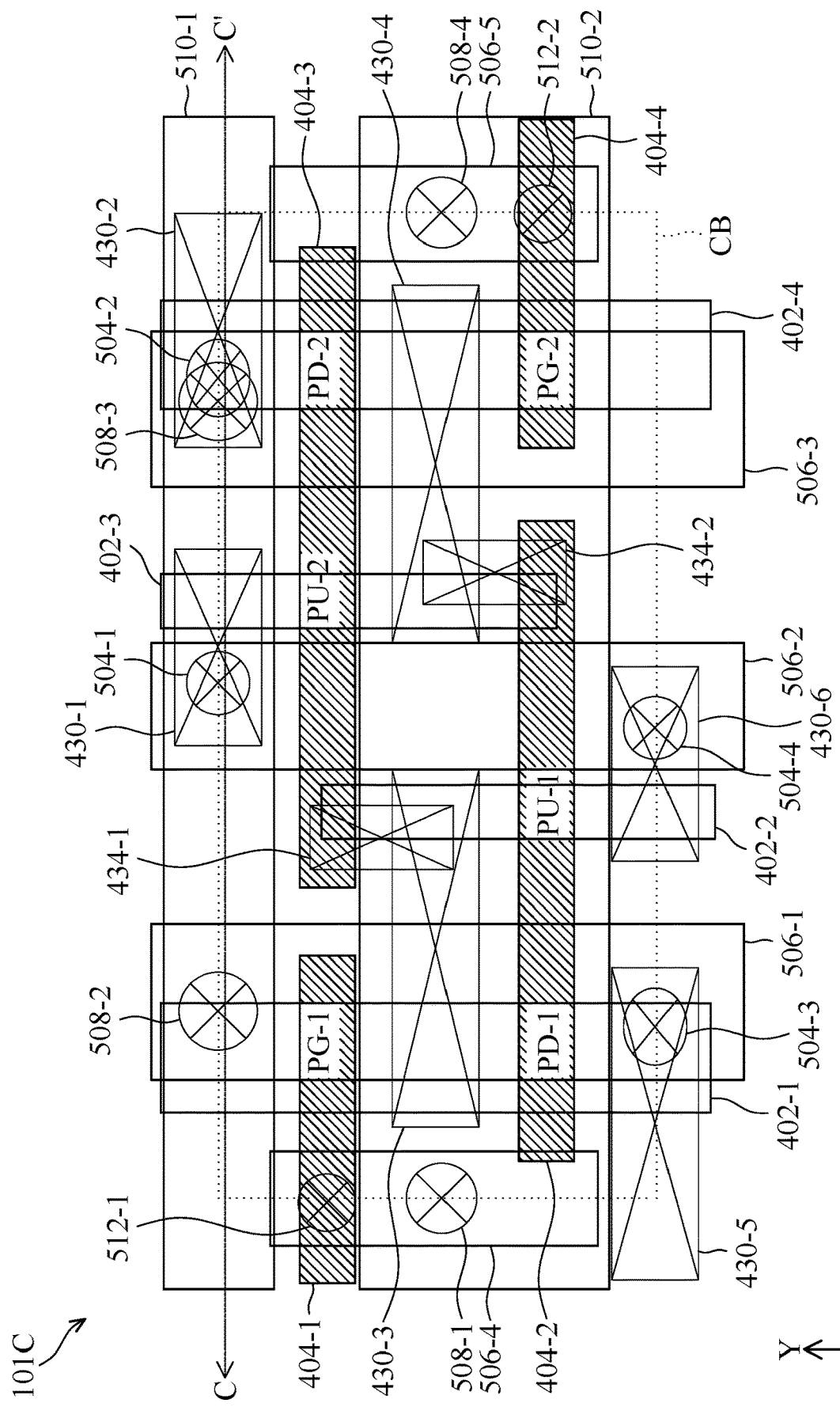
FIGS. 10A and 10B illustrate top views (or layouts) of an SRAM cell that can be one embodiment of the SRAM cells implemented in the array, in accordance with some embodiments of the present disclosure.
Figure 10B:
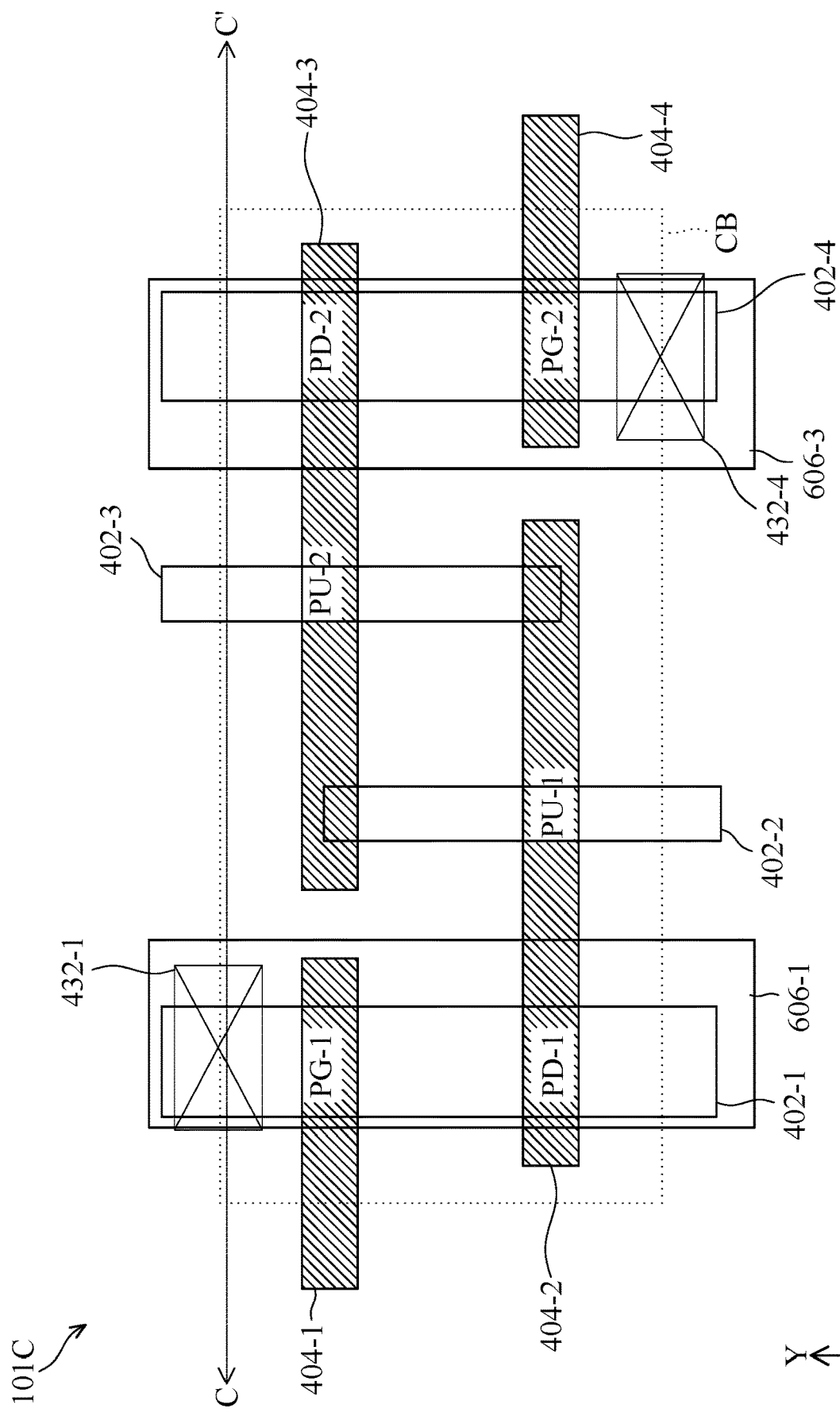
Figure 10C:
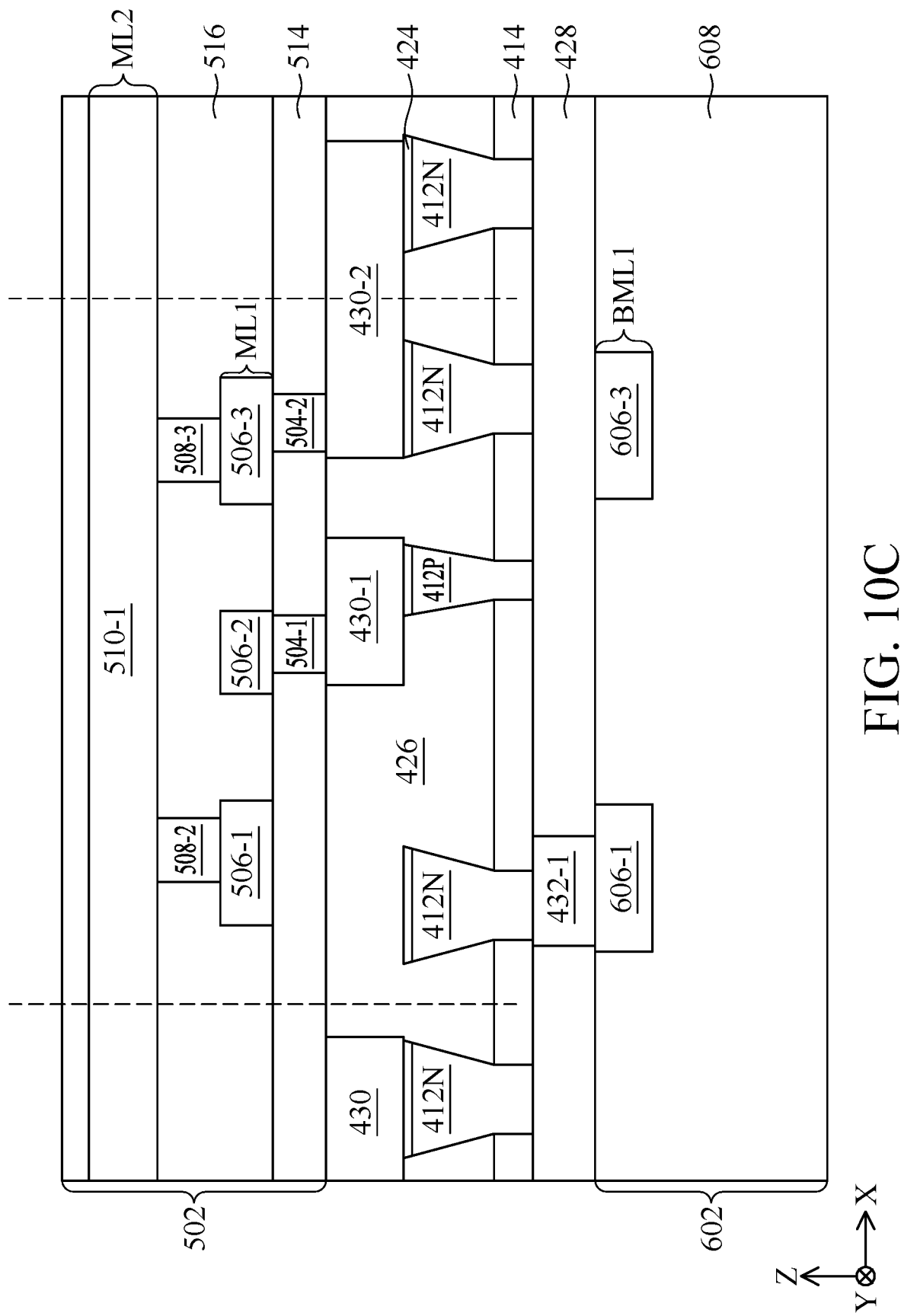
FIG. 10C illustrates a cross sectional view of the SRAM cell along a line C-C' in FIGS. 10A and 10B, in accordance with some embodiments of the present disclosure.

FIGS. 10A and 10B illustrate top views (or layouts) of an SRAM cell 101C that can be one embodiment of the SRAM cells 101 implemented in the array 100, in accordance with some embodiments of the present disclosure. FIG. 10A illustrates the features in the device region (including transistors) and the front-side interconnection structure (including vias and metal conductors), and FIG. 10B illustrates the features in the device region and the back-side interconnection structure. FIG. 10C illustrates a cross sectional view of the SRAM cell 101C along a line C-C' in FIGS. 10A and 10B, in accordance with some embodiments of the present disclosure.

The SRAM cell 101C is similar to the SRAM cell 101B discussed above, except that no back-side VDD line is formed. The source/drain contact 432-2, source/drain contact the 432-3, and the metal conductor 606-2 shown in the SRAM cell 101B are not formed in the SRAM cell 101C. As such, as shown in FIGS. 10A to 10C, the single metal conductor 506-2 serves as the VDD line that is electrically connected to the source/drain features 412P of the pull-up transistor PU-1 through the via 504-4, and is electrically connected to the source/drain features 412P of the pull-up transistor PU-2 through the via 504-1. In this embodiment, the cost of forming source/drain contact 432-2, source/drain contact the 432-3, and the metal conductor 606-2 can be reduced and the metal conductors 606-1 and 606-3 may be designed with a wider width (than that of the SRAM cell 101A) to reduce circuit resistance.

Figure 11A:
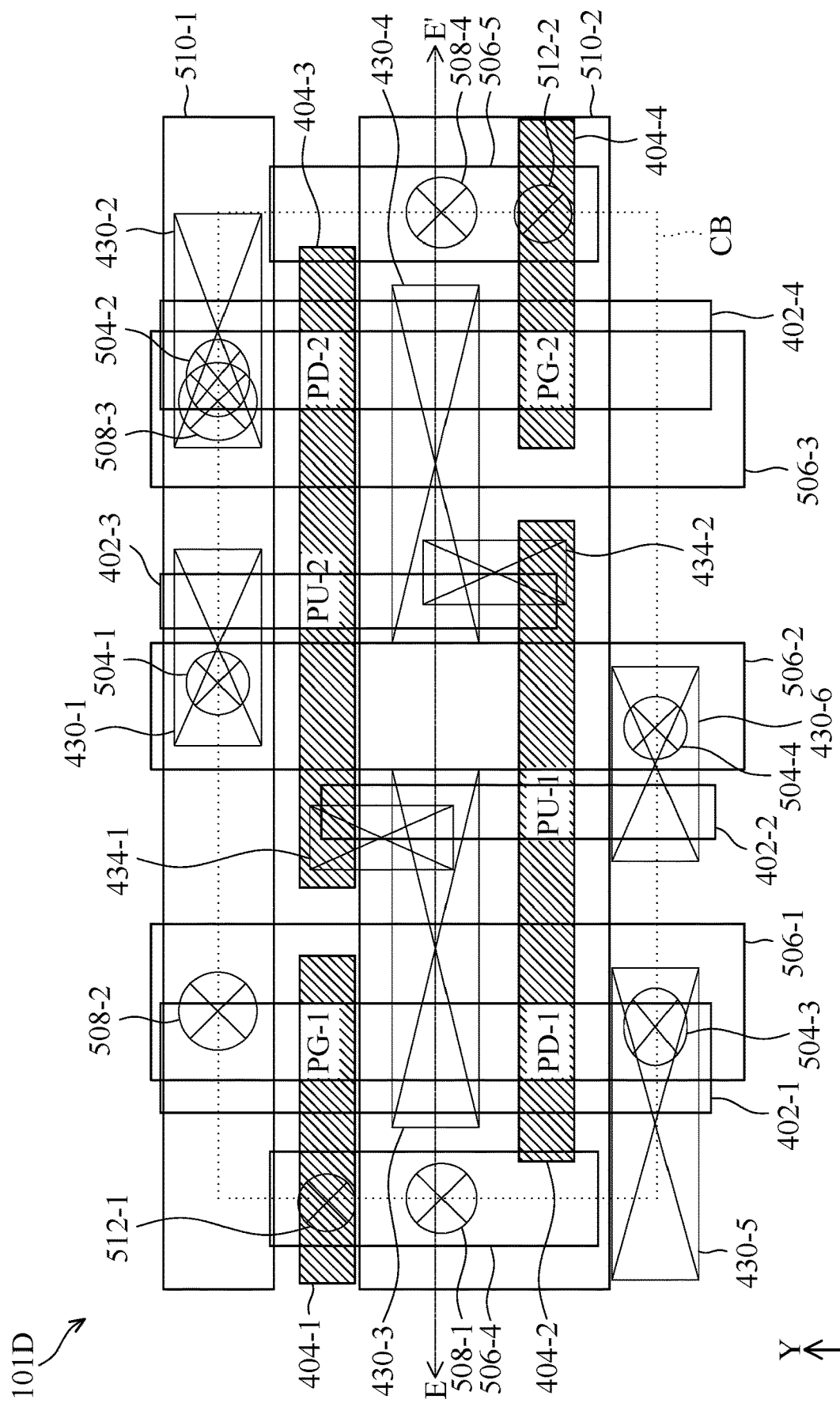
FIGS. 11A and 11B illustrate top views (or layouts) of an SRAM cell that can be one embodiment of the SRAM cells implemented in the array, in accordance with some embodiments of the present disclosure.
Figure 11B:
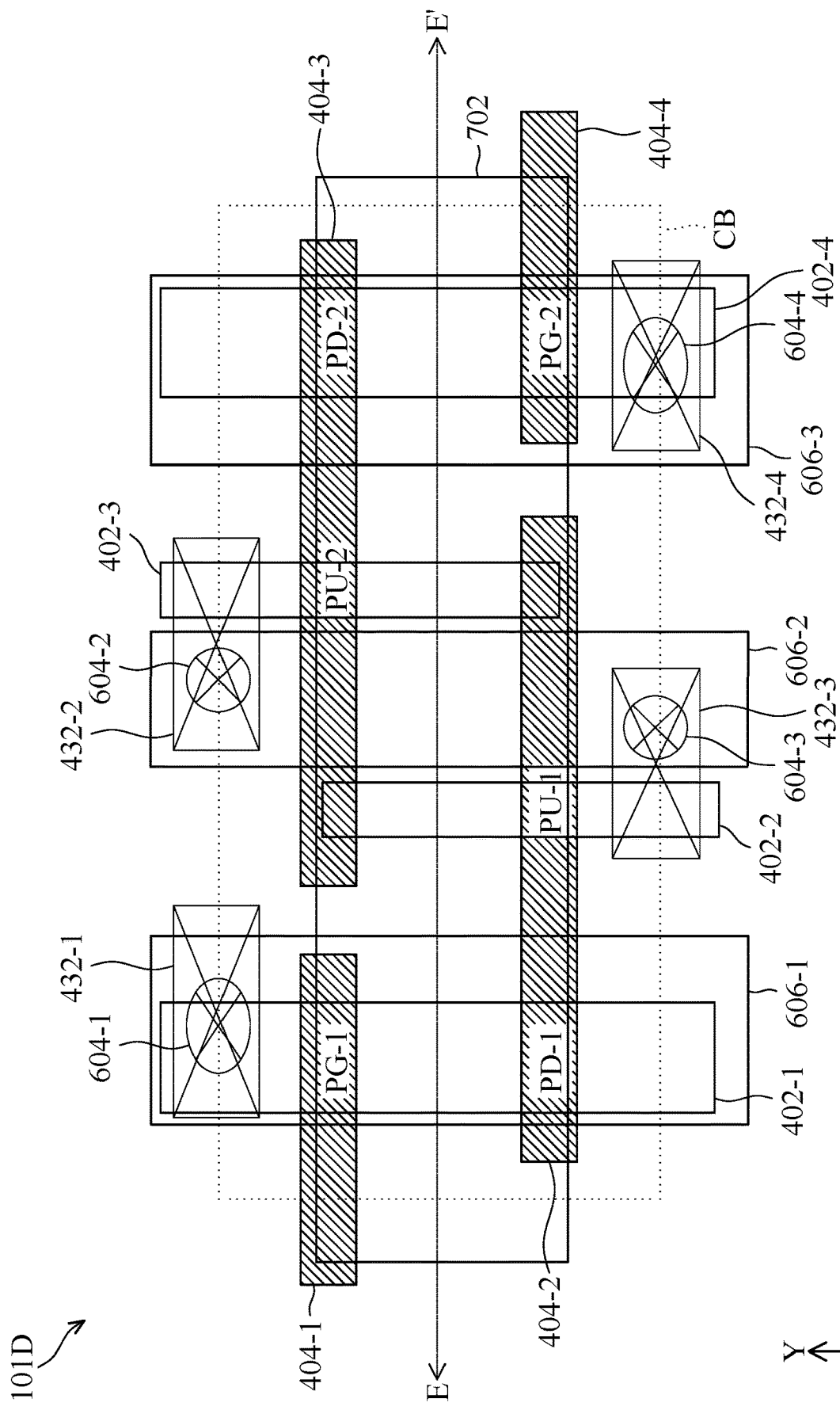
Figure 11C:
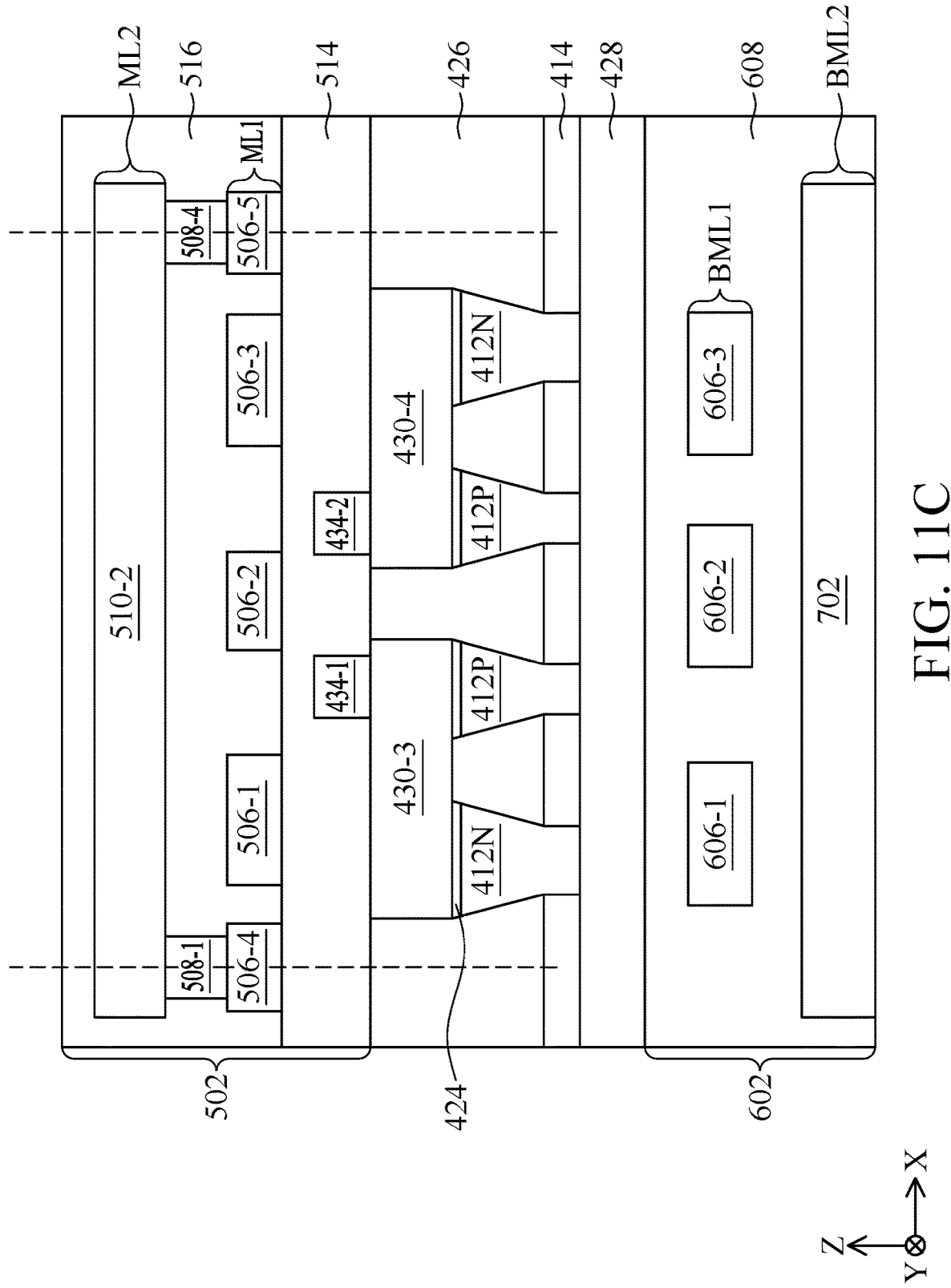
FIG. 11C illustrates a cross sectional view of the SRAM cell along a line C-C' in FIGS. 11A and 11B, in accordance with some embodiments of the present disclosure.

FIGS. 11A and 11B illustrate top views (or layouts) of an SRAM cell 101D that can be one embodiment of the SRAM cells 101 implemented in the array 100, in accordance with some embodiments of the present disclosure. FIG. 11A illustrates the features in the device region (including transistors) and the front-side interconnection structure (including vias and metal conductors), and FIG. 11B illustrates the features in the device region and the back-side interconnection structure. FIG. 11C illustrates a cross sectional view of the SRAM cell 101D along a line C-C' in FIGS. 11A and 11B, in accordance with some embodiments of the present disclosure.

The SRAM cell 101D is similar to the SRAM cell 101A discussed above, except that the SRAM cell 101D further includes a metal conductor 702 in back-side interconnection structure 602. The metal conductors 702 are in a (back-side) metal layer BML2 in the IMD layer 608 and extend lengthwise in the X-direction. The metal layer BML2 is under the metal layer BML1, and thus the metal conductors 702 are under the metal conductors 606.

In some embodiments, the metal conductor 702 serves as the word-line that is electrically connected to the metal conductor 510-2 (serving as the word-line) for a double world-line connection. The metal conductor 510-2 and 702 may extend in the X-direction to the edge cell regions (e.g., the edge cell regions 105A or 105B discussed above) of the array constructed by the SRAM cells 101D, and then be electrically connected with each other through the tap structures (e.g., the tap structures 2000 discussed above) located at the edge cell regions. In some embodiments, the metal conductor 702 may be referred to as (back-side) word-line conductor.

Figure 12A:
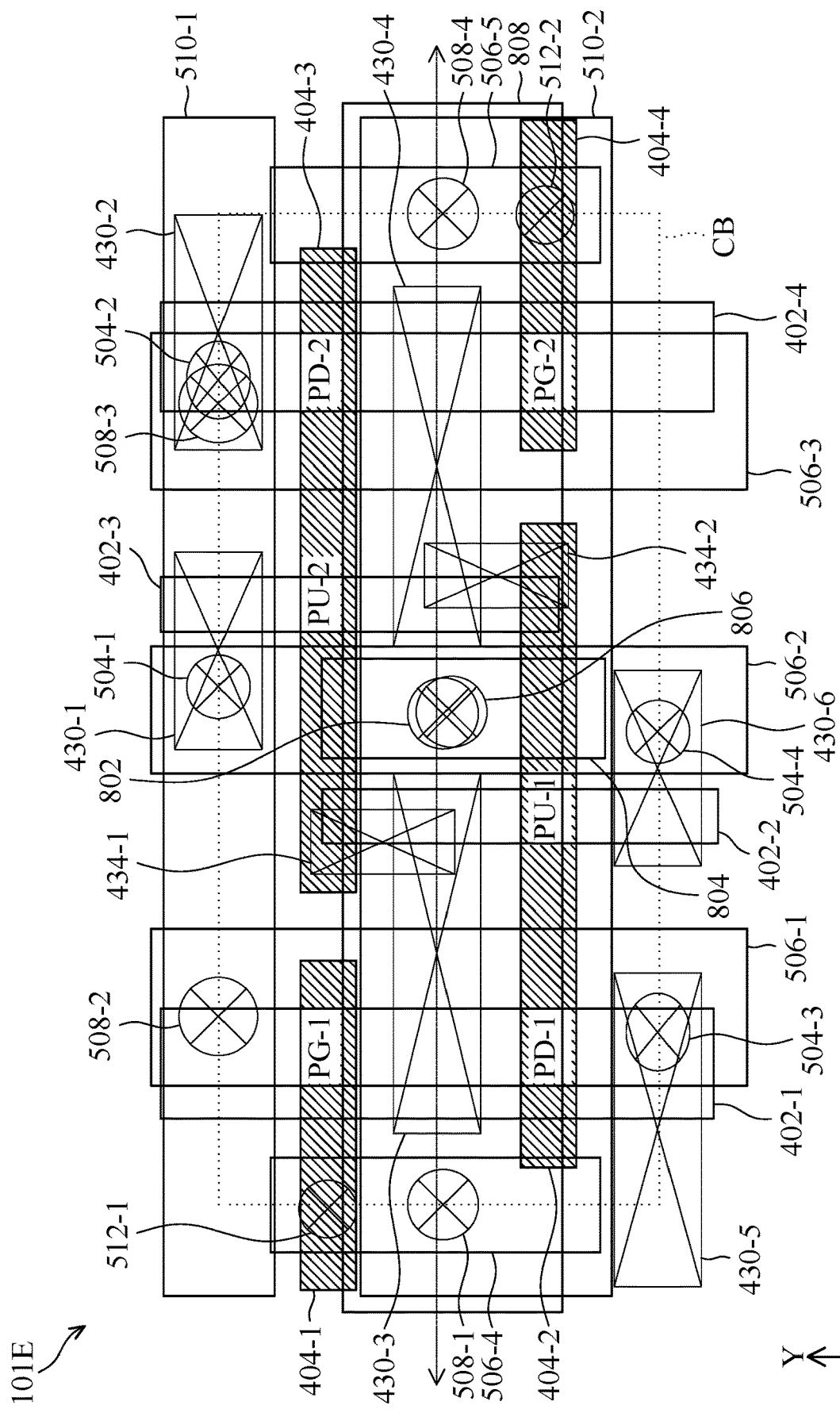
FIGS. 12A and 12B illustrate top views (or layouts) of an SRAM cell that can be one embodiment of the SRAM cells implemented in the array, in accordance with some embodiments of the present disclosure.
Figure 12B:
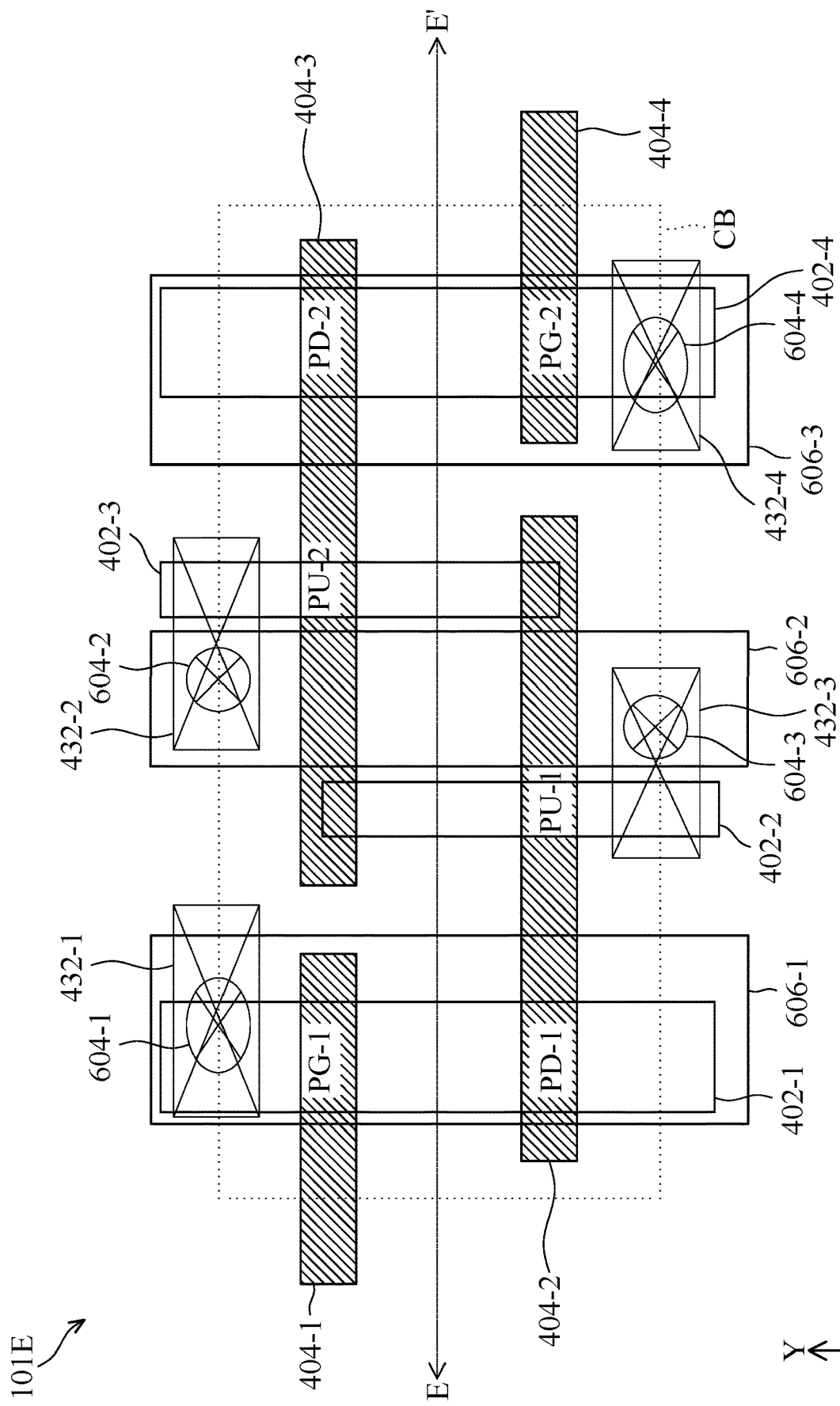
Figure 12C:
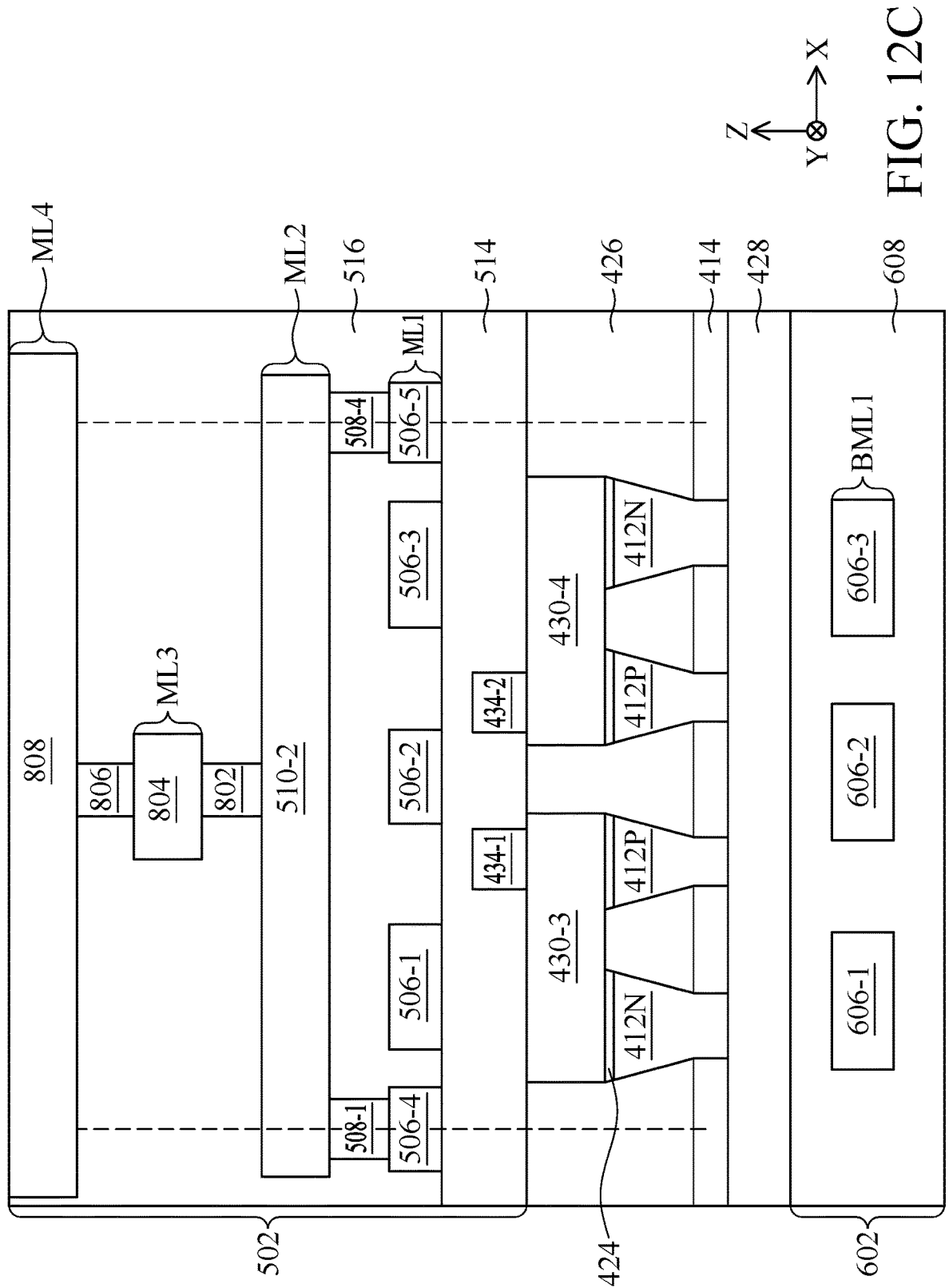
FIG. 12C illustrates a cross sectional view of the SRAM cell along a line C-C' in FIGS. 12A and 12B, in accordance with some embodiments of the present disclosure.

FIGS. 12A and 12B illustrate top views (or layouts) of an SRAM cell 101E that can be one embodiment of the SRAM cells 101 implemented in the array 100, in accordance with some embodiments of the present disclosure. FIG. 12A illustrates the features in the device region (including transistors) and the front-side interconnection structure (including vias and metal conductors), and FIG. 12B illustrates the features in the device region and the back-side interconnection structure. FIG. 12C illustrates a cross sectional view of the SRAM cell 101E along a line C-C' in FIGS. 12A and 12B, in accordance with some embodiments of the present disclosure.

The SRAM cell 101E is similar to the SRAM cell 101A discussed above, except that the SRAM cell 101E further includes a via 802, a metal conductor 804, a via 806, a the metal conductors 808, which are over (or at the front-side of) the transistors in the SRAM cell 101E (e.g., the pass-gate transistors PG-1 and PG-2, the pull-down transistors PD-1 and PD-2, and the pull-up transistors PU-1 and PU-2).

The metal conductor 804 are in a metal layer ML3 in the IMD layer 516 and extend lengthwise in the Y-direction. The metal conductors 808 are in a metal layer ML4 in the IMD layer 516 and extend lengthwise in the X-direction. The metal layer ML3 is over the metal layer ML2 and the metal layer ML4 is over the metal layer ML3, and thus the metal conductors 804 are over the metal conductors 510-2 and the metal conductors 808 are over the metal conductor 804. The via 802 in the IMD layer 516 is vertically between and electrically connected to the metal conductor 510-2 and the metal conductor 804. The via 806 in the IMD layer 516 is vertically between and electrically connected to the metal conductor 804 and the metal conductor 808. In some embodiments, the vias 802 and 804 may have circular shape in the top view. In other embodiments, the vias 802 and 804 may have a rectangular shape in the top view.

In some embodiments, the metal conductor 808 serves as the word-line that is electrically connected to the metal conductor 510-2 (serving as the word-line) for a double world-line connection. The metal conductor 808 is electrically connected to the metal conductor 510-2 through the via 806, the metal conductor 804, and the via 802. In some embodiments, the metal conductor 808 may be referred to as (front-side) word-line conductor.

Figure 13A:
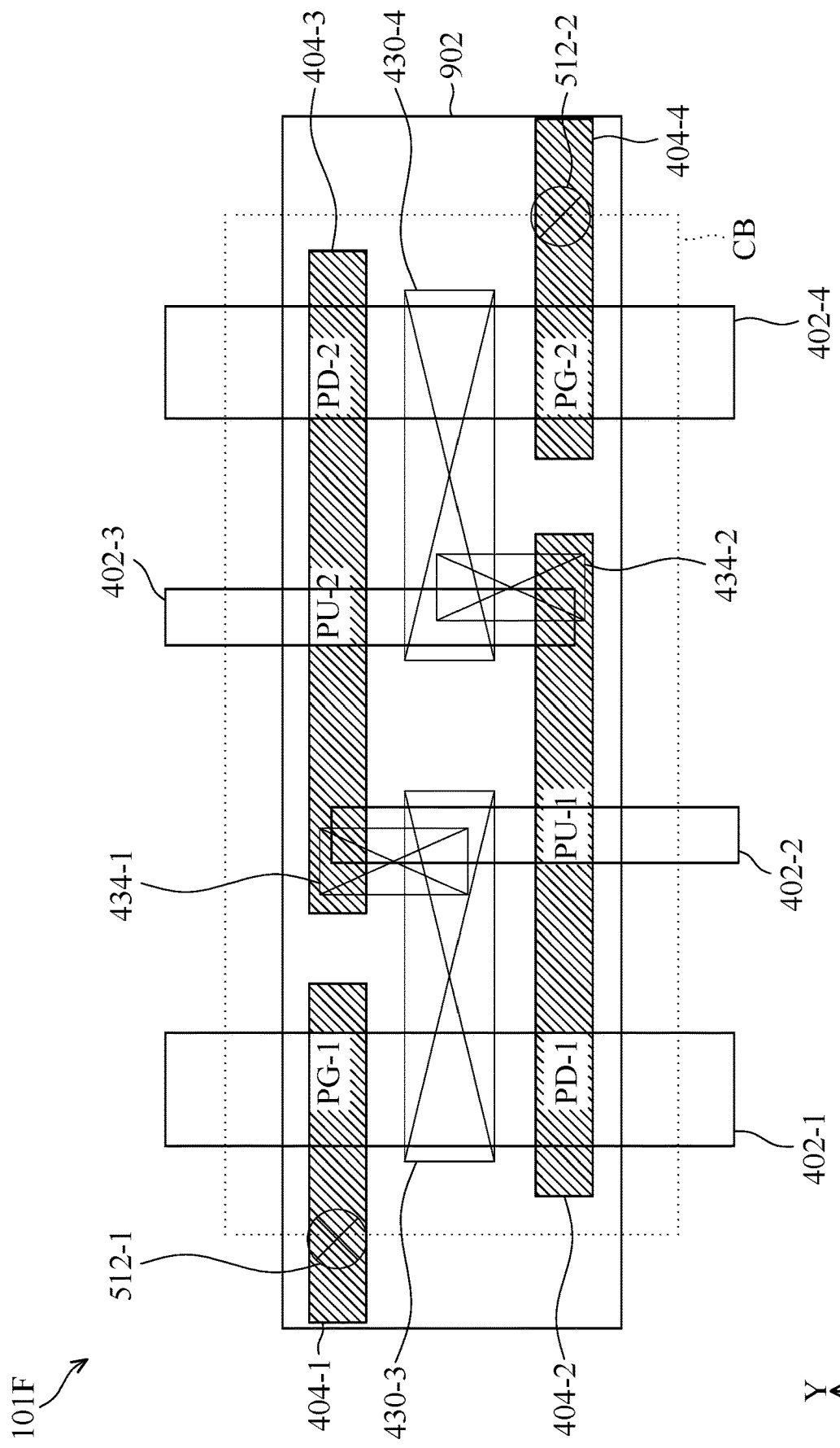
FIGS. 13A and 13B illustrate top views (or layouts) of an SRAM cell that can be one embodiment of the SRAM cells implemented in the array, in accordance with some embodiments of the present disclosure.
Figure 13B:
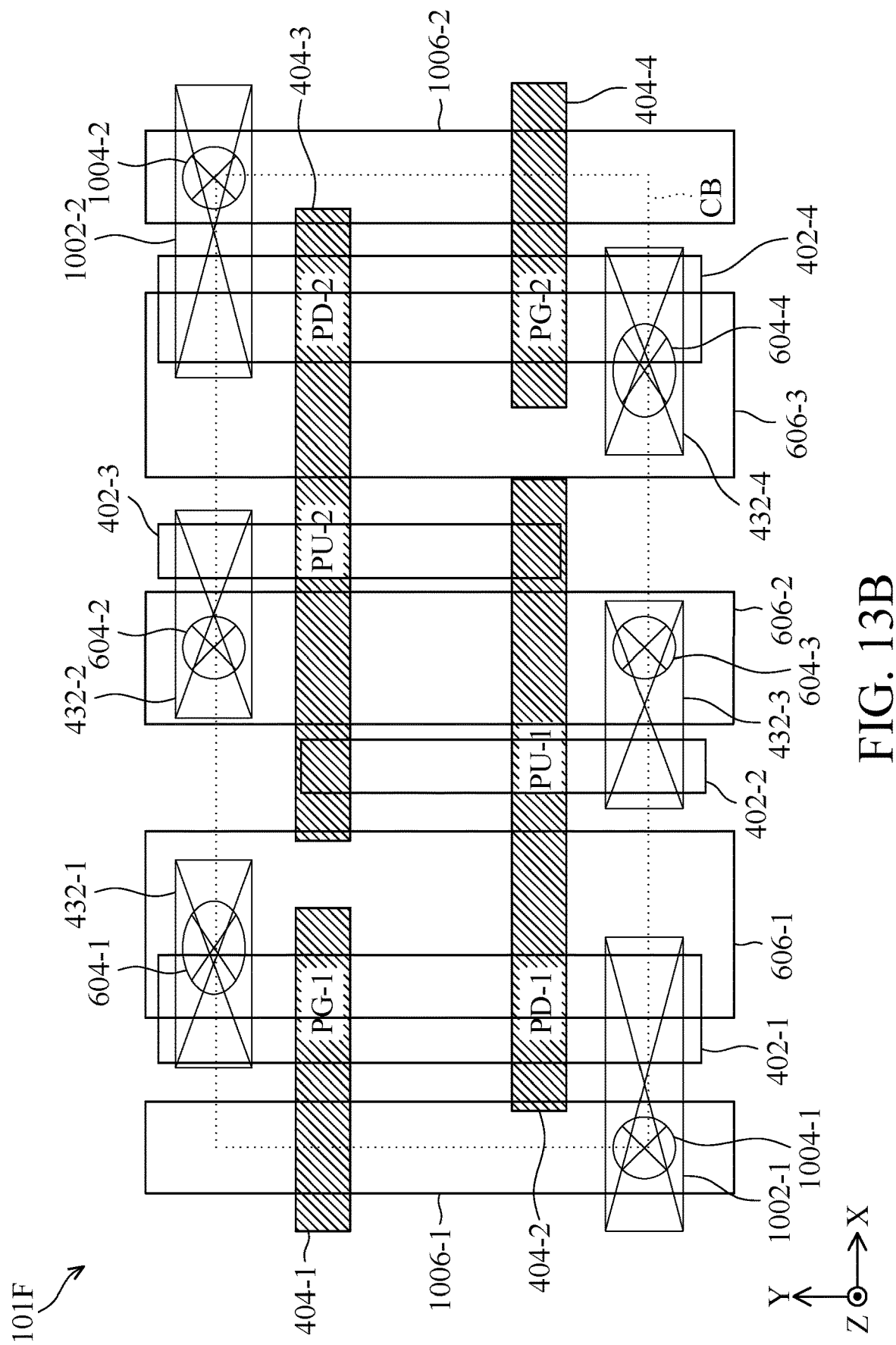

FIGS. 13A and 13B illustrate top views (or layouts) of an SRAM cell 101F that can be one embodiment of the SRAM cells 101 implemented in the array 100, in accordance with some embodiments of the present disclosure. FIG. 13A illustrates the features in the device region (including transistors) and the front-side interconnection structure (including vias and metal conductors), and FIG. 13B illustrates the features in the device region and the back-side interconnection structure.

The SRAM cell 101F is similar to the SRAM cell 101A discussed above, except that the metal conductor for word-line is formed in the metal layer BML1, the metal conductors for VSS lines are formed in the back-side interconnection structure 602, and no metal conductor for VDD line in the front-side interconnection structure 502. The source/drain contacts 430, the vias 504, the metal conductors 506, the vias 508, and the metal conductors 510 shown in the SRAM cell 101A are not formed in the SRAM cell 101F. The front-side interconnection structure 502 of the SRAM cell 101F further includes a metal conductor 902, which is over (or at the front-side of) the transistors in the SRAM cell 101F (e.g., the pass-gate transistors PG-1 and PG-2, the pull-down transistors PD-1 and PD-2, and the pull-up transistors PU-1 and PU-2).

The metal conductor 902 is in the metal layer ML1 in the IMD layer 516 and extend lengthwise in the X-direction. In some embodiments, the metal conductor 902 serves as the word-line that is electrically connected to a controller (e.g., the controller 103 discussed above) and electrically connected to the gate structures (more specifically, the gate electrodes) of the pass-gate transistors in the same row of the array of the SRAM cell. As shown in FIGS. 13A to 13B, in the SRAM cell 101F, the metal conductor 902 is over the pass-gate transistor PG-1 and PG-2. The metal conductor 902 is electrically connected to the gate structure 404-1 of the pass-gate transistor PG-1 through the gate via 512-1, and is electrically connected to the gate structure 404-4 of the pass-gate transistor PG-2 through the gate via 512-2. In some embodiments, the metal conductor 902 may be referred to as (front-side) word-line conductor. In this embodiment, the metal conductor 902 may be designed with wider width (than the metal conductor 510-2 of the SRAM cell 101A) to reduce circuit resistance.

The SRAM cell 101F further includes source/drain contacts 1002 (including source/drain contacts 1002-1 and 1002-2), and vias 1004 (including vias 1004-1 and 1004-2) and metal conductors 1006 (including metal conductors 1006-1 and 1006-2) in the back-side interconnection structure 602, which are under (or at the back-side of) the transistors in the SRAM cell 101F (e.g., the pass-gate transistors PG-1 and PG-2, the pull-down transistors PD-1 and PD-2, and the pull-up transistors PU-1 and PU-2).

As shown in FIG. 13B, the source/drain contacts 1002 extend lengthwise in the X-direction. The source/drain contact 1002-1 is under and electrically connected to the source/drain feature 412N of the pull-down transistor PD-1; and the source/drain contact 1002-2 is under and electrically connected to the source/drain feature 412N of the pull-down transistor PD-2.

The metal conductors 1006 are in the metal layer BML1 in the IMD layer 608 and extend lengthwise in the Y-direction. The metal conductors 1006 overlap cell short boundaries of the cell boundary CB of the SRAM cell 101F in the Y-direction, as shown in FIG. 13B. In some embodiments, the metal conductors 1006-1 and 1006-2 serve as the VSS lines that are electrically coupled to a voltage node or voltage source (not shown) (e.g., the voltage node (or voltage source) VSS discussed above) and electrically connected to the source/drain features of the pull-down transistors in the same column of the array of the SRAM cell. As shown in FIGS. 13A and 13B, in the SRAM cell 101F, the metal conductor 1006-1 and 1006-2 are respectively under the pull-down transistor PD-1 and PD-2. The metal conductor 1006-1 is electrically connected to the source/drain features 412N of the pull-down transistor PD-1 through the via 1004-1 and the source/drain contact 1002-1; and the metal conductor 1006-2 is electrically connected to the source/drain features 412N of the pull-down transistor PD-2 through the via 1004-2 and the source/drain contact 1002-2. In some embodiments, the metal conductors 1006-1 and 1006-2 may be referred to as (back-side) VSS conductors or (back-side) VSS lines.

Figure 14A:
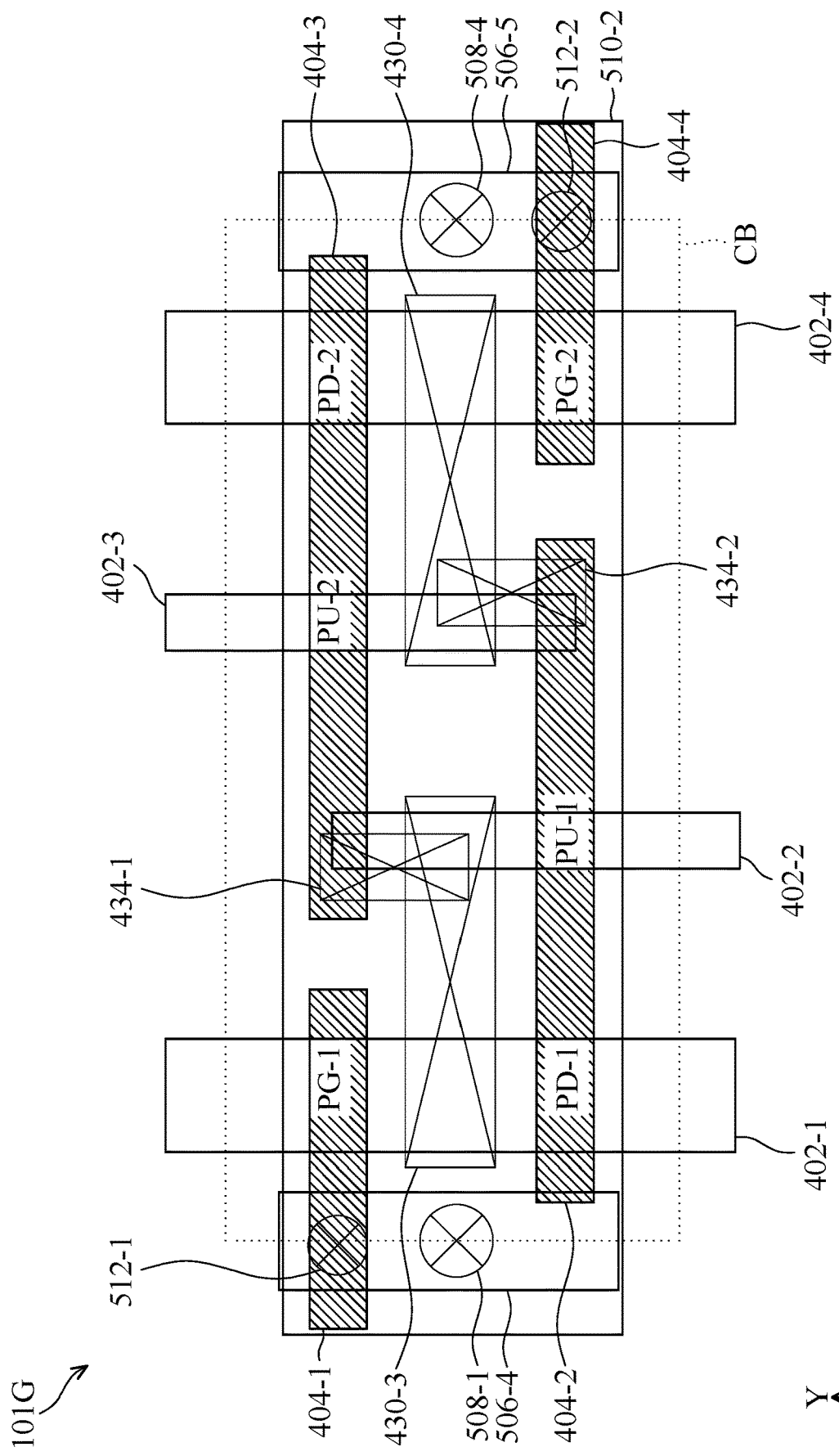
FIGS. 14A and 14B illustrate top views (or layouts) of an SRAM cell that can be one embodiment of the SRAM cells implemented in the array, in accordance with some embodiments of the present disclosure.
Figure 14B:
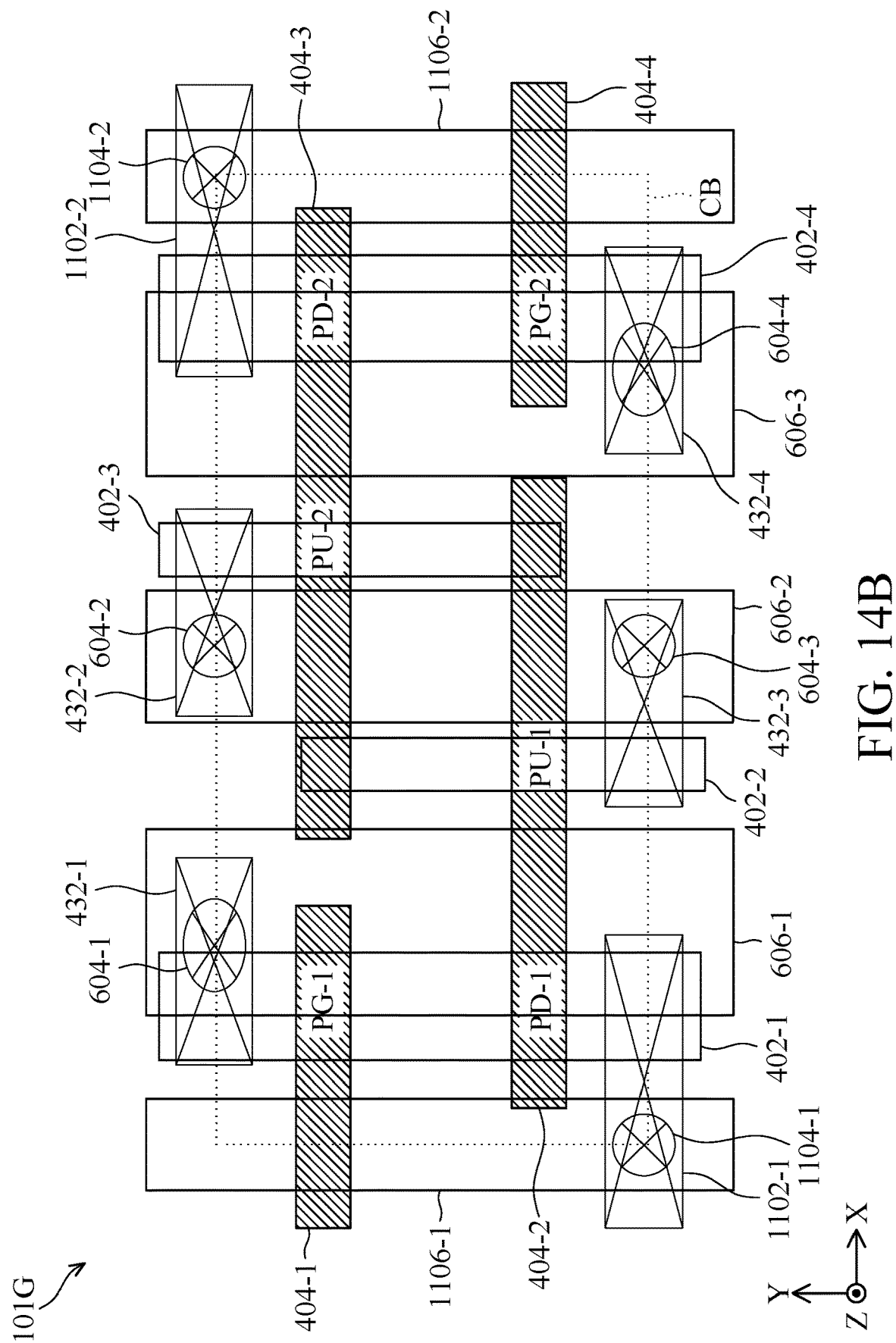

FIGS. 14A and 14B illustrate top views (or layouts) of an SRAM cell 101G that can be one embodiment of the SRAM cells 101 implemented in the array 100, in accordance with some embodiments of the present disclosure. FIG. 14A illustrates the features in the device region (including transistors) and the front-side interconnection structure (including vias and metal conductors), and FIG. 14B illustrates the features in the device region and the back-side interconnection structure.

The SRAM cell 101G is similar to the SRAM cell 101A discussed above, except that the metal conductors for VSS lines are formed in the back-side interconnection structure 602, and no metal conductor for VDD line in the front-side interconnection structure 502. The source/drain contacts 430, the vias 504, the metal conductors 506-1 to 506-3, the vias 508-2 and 508-3, and the metal conductor 510-1 shown in the SRAM cell 101A are not formed in the SRAM cell 101G. The SRAM cell 101G further includes source/drain contacts 1102 (including source/drain contacts 1102-1 and 1102-2), and vias 1104 (including vias 1104-1 and 1104-2) and metal conductors 1106 (including metal conductors 1106-1 and 1106-2) in the back-side interconnection structure 602, which are under (or at the back-side of) the transistors in the SRAM cell 101G (e.g., the pass-gate transistors PG-1 and PG-2, the pull-down transistors PD-1 and PD-2, and the pull-up transistors PU-1 and PU-2).

As shown in FIG. 14B, the source/drain contacts 1102 extend lengthwise in the X-direction. The source/drain contact 1102-1 is under and electrically connected to the source/drain feature 412N of the pull-down transistor PD-1; and the source/drain contact 1102-2 is under and electrically connected to the source/drain feature 412N of the pull-down transistor PD-2.

The metal conductors 1106 are in the metal layer BML1 in the IMD layer 608 and extend lengthwise in the Y-direction. The metal conductors 1106 overlap cell short boundaries of the cell boundary CB of the SRAM cell 101G in the Y-direction, as shown in FIG. 14B. In some embodiments, the metal conductors 1106-1 and 1106-2 serve as the VSS lines that are electrically coupled to a voltage node or voltage source (not shown) (e.g., the voltage node (or voltage source) VSS discussed above) and electrically connected to the source/drain features of the pull-down transistors in the same column of the array of the SRAM cell. As shown in FIGS. 14A and 14B, in the SRAM cell 101G, the metal conductor 1106-1 and 1106-2 are respectively under the pull-down transistor PD-1 and PD-2. The metal conductor 1106-1 is electrically connected to the source/drain features 412N of the pull-down transistor PD-1 through the via 1104-1 and the source/drain contact 1102-1; and the metal conductor 1106-2 is electrically connected to the source/drain features 412N of the pull-down transistor PD-2 through the via 1104-2 and the source/drain contact 1102-2. In some embodiments, the metal conductors 1106-1 and 1106-2 may be referred to as (back-side) VSS conductors or (back-side) VSS lines.

Figure 15A:
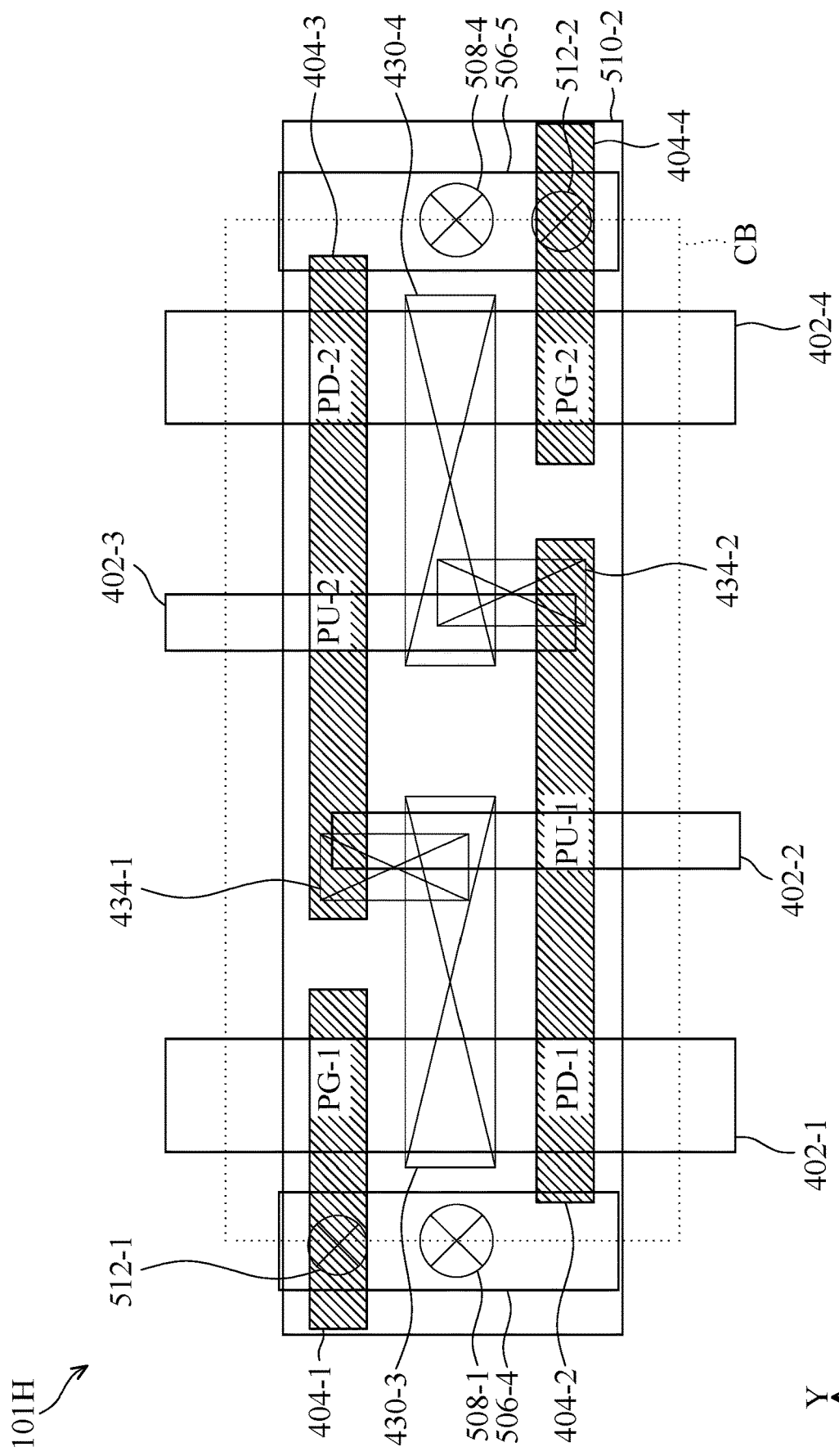
FIGS. 15A and 15B illustrate top views (or layouts) of an SRAM cell that can be one embodiment of the SRAM cells implemented in the array, in accordance with some embodiments of the present disclosure.
Figure 15B:
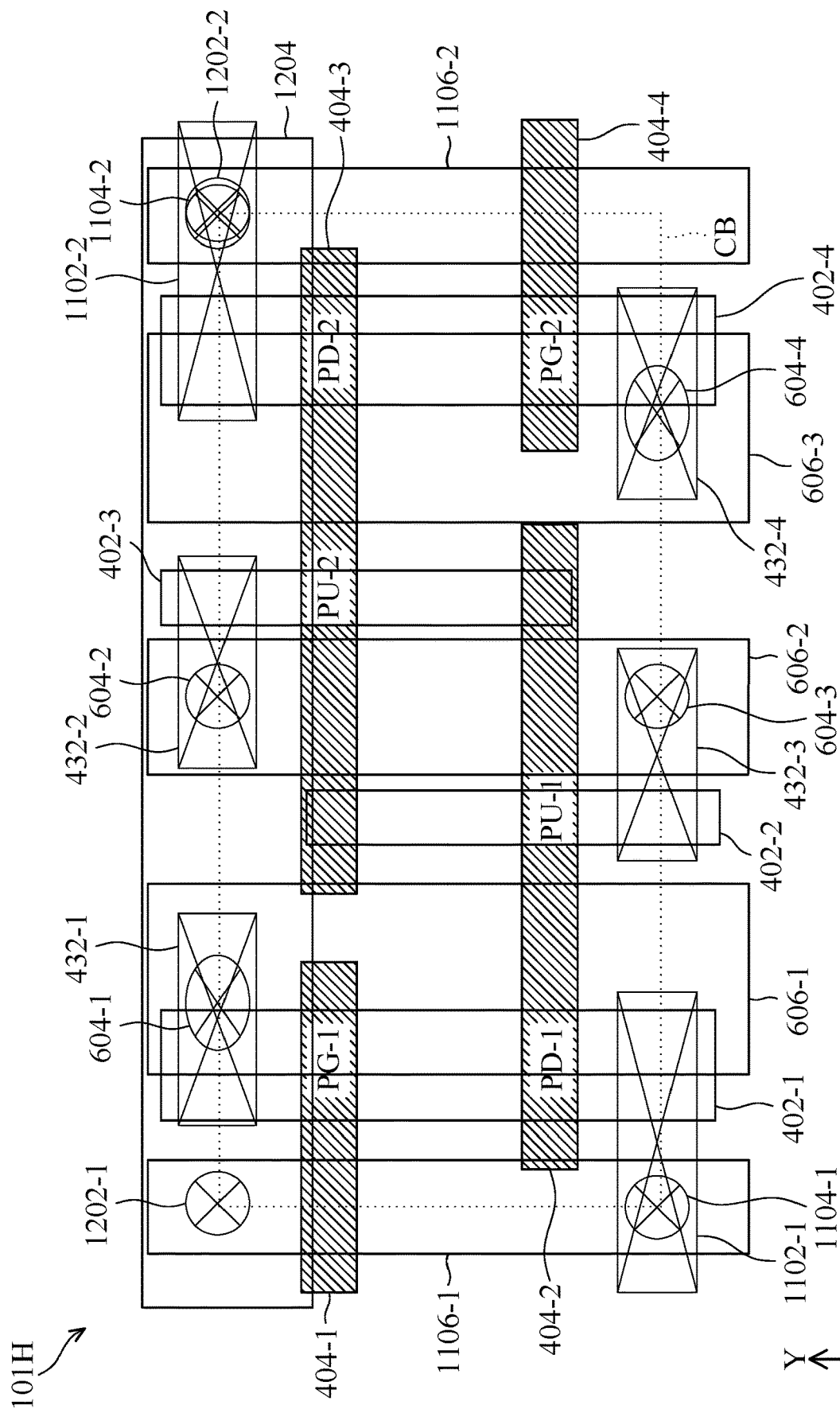

FIGS. 15A and 15B illustrate top views (or layouts) of an SRAM cell 101H that can be one embodiment of the SRAM cells 101 implemented in the array 100, in accordance with some embodiments of the present disclosure. FIG. 15A illustrates the features in the device region (including transistors) and the front-side interconnection structure (including vias and metal conductors), and FIG. 15B illustrates the features in the device region and the back-side interconnection structure.

The SRAM cell 101H is similar to the SRAM cell 101G discussed above, except that the SRAM cell 101H further includes vias 1202 (including vias 1202-1 and 1202-2) and a metal conductor 1204, which are under (or at the back-side of) the transistors in the SRAM cell 101H (e.g., the pass-gate transistors PG-1 and PG-2, the pull-down transistors PD-1 and PD-2, and the pull-up transistors PU-1 and PU-2).

The metal conductor 1204 is in a metal layer BML2 in the IMD layer 608 and extend lengthwise in the X-direction. The metal layer BML2 is under the metal layer BML1, and thus the metal conductor 1204 is under the metal conductors 606 and 1106. The metal conductor 1204 is electrically connected to the metal conductors 1106-1 and 1106-2 to serve as the power mesh line for connecting the voltage node VSS to the metal conductors 1106-1 and 1106-3. As shown in FIGS. 15A and 15B, in the SRAM cell 101H, the metal conductor 1204 is electrically connected to the metal conductor 1106-1 through the via 1202-1 and electrically connected to the metal conductor 1106-2 through the via 1202-2. In some embodiments, the metal conductor 1204 may be referred to as (front-side) VSS power mesh line or VSS power mesh conductor.

Figure 16A:
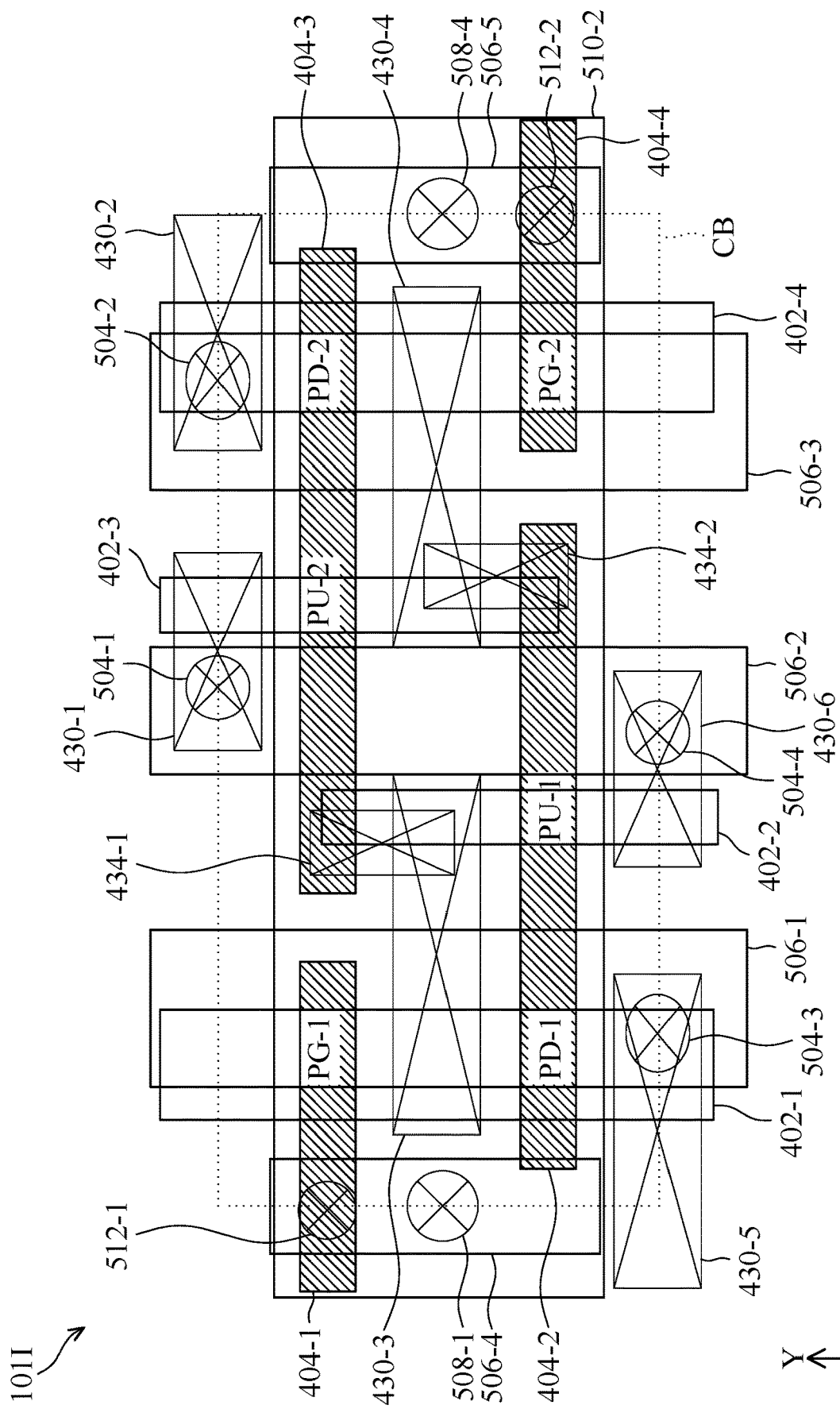
FIGS. 16A and 16B illustrate top views (or layouts) of an SRAM cell that can be one embodiment of the SRAM cells implemented in the array, in accordance with some embodiments of the present disclosure.
Figure 16B:
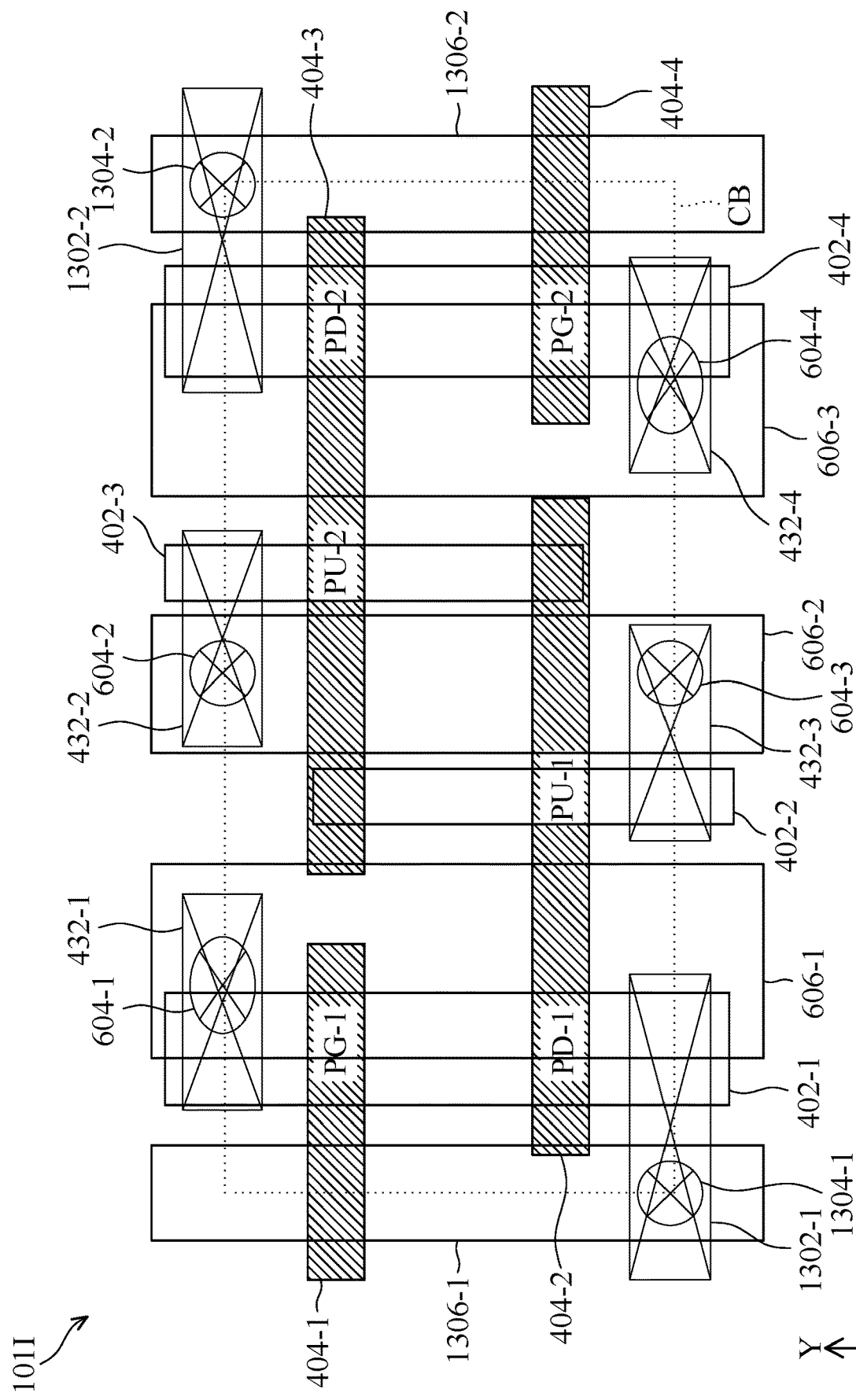

FIGS. 16A and 16B illustrate top views (or layouts) of an SRAM cell 101I that can be one embodiment of the SRAM cells 101 implemented in the array 100, in accordance with some embodiments of the present disclosure. FIG. 16A illustrates the features in the device region (including transistors) and the front-side interconnection structure (including vias and metal conductors), and FIG. 16B illustrates the features in the device region and the back-side interconnection structure.

The SRAM cell 101I is similar to the SRAM cell 101A discussed above, except that the metal conductors for VSS lines are formed in the back-side interconnection structure 602. The vias 508-2 and 508-3, and the metal conductor 510-1 shown in the SRAM cell 101A are not formed in the SRAM cell 101I. The SRAM cell 101I further includes source/drain contacts 1302 (including source/drain contacts 1302-1 and 1302-2), and vias 1304 (including vias 1304-1 and 1304-2) and metal conductors 1306 (including metal conductors 1306-1 and 1306-2) in the back-side interconnection structure 602, which are under (or at the back-side of) the transistors in the SRAM cell 101I (e.g., the pass-gate transistors PG-1 and PG-2, the pull-down transistors PD-1 and PD-2, and the pull-up transistors PU-1 and PU-2).

As shown in FIG. 16B, the source/drain contacts 1302 extend lengthwise in the X-direction. The source/drain contact 1302-1 is under and electrically connected to the source/drain feature 412N of the pull-down transistor PD-1; and the source/drain contact 1302-2 is under and electrically connected to the source/drain feature 412N of the pull-down transistor PD-2.

The metal conductors 1306 are in the metal layer BML1 in the IMD layer 608 and extend lengthwise in the Y-direction. The metal conductors 1306 overlap cell short boundaries of the cell boundary CB of the SRAM cell 101I in the Y-direction, as shown in FIG. 16B. In some embodiments, the metal conductors 1306-1 and 1306-2 serve as the VSS lines that are electrically coupled to a voltage node or voltage source (not shown) (e.g., the voltage node (or voltage source) VSS discussed above) and electrically connected to the source/drain features of the pull-down transistors in the same column of the array of the SRAM cell. As shown in FIGS. 16A and 16B, in the SRAM cell 101I, the metal conductor 1306-1 and 1306-2 are respectively under the pull-down transistor PD-1 and PD-2. The metal conductor 1306-1 is electrically connected to the source/drain features 412N of the pull-down transistor PD-1 through the via 1304-1 and the source/drain contact 1302-1; and the metal conductor 1306-2 is electrically connected to the source/drain features 412N of the pull-down transistor PD-2 through the via 1304-2 and the source/drain contact 1302-2.

In some embodiments, the metal conductors 1306-1 and 1306-2 may be referred to as (back-side) VSS conductors or (back-side) VSS lines.

Figure 17A:
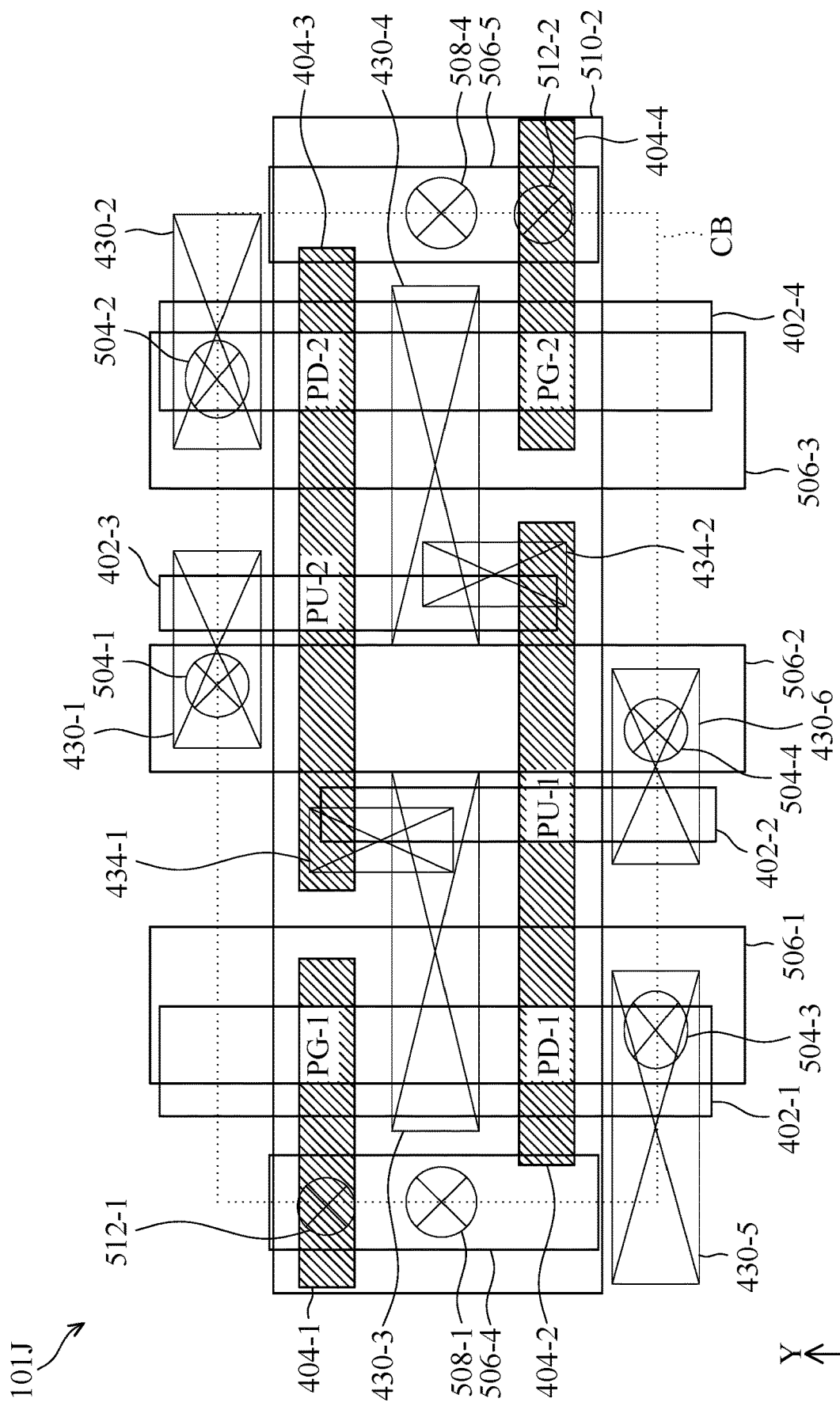
FIGS. 17A and 17B illustrate top views (or layouts) of an SRAM cell that can be one embodiment of the SRAM cells implemented in the array, in accordance with some embodiments of the present disclosure.
Figure 17B:
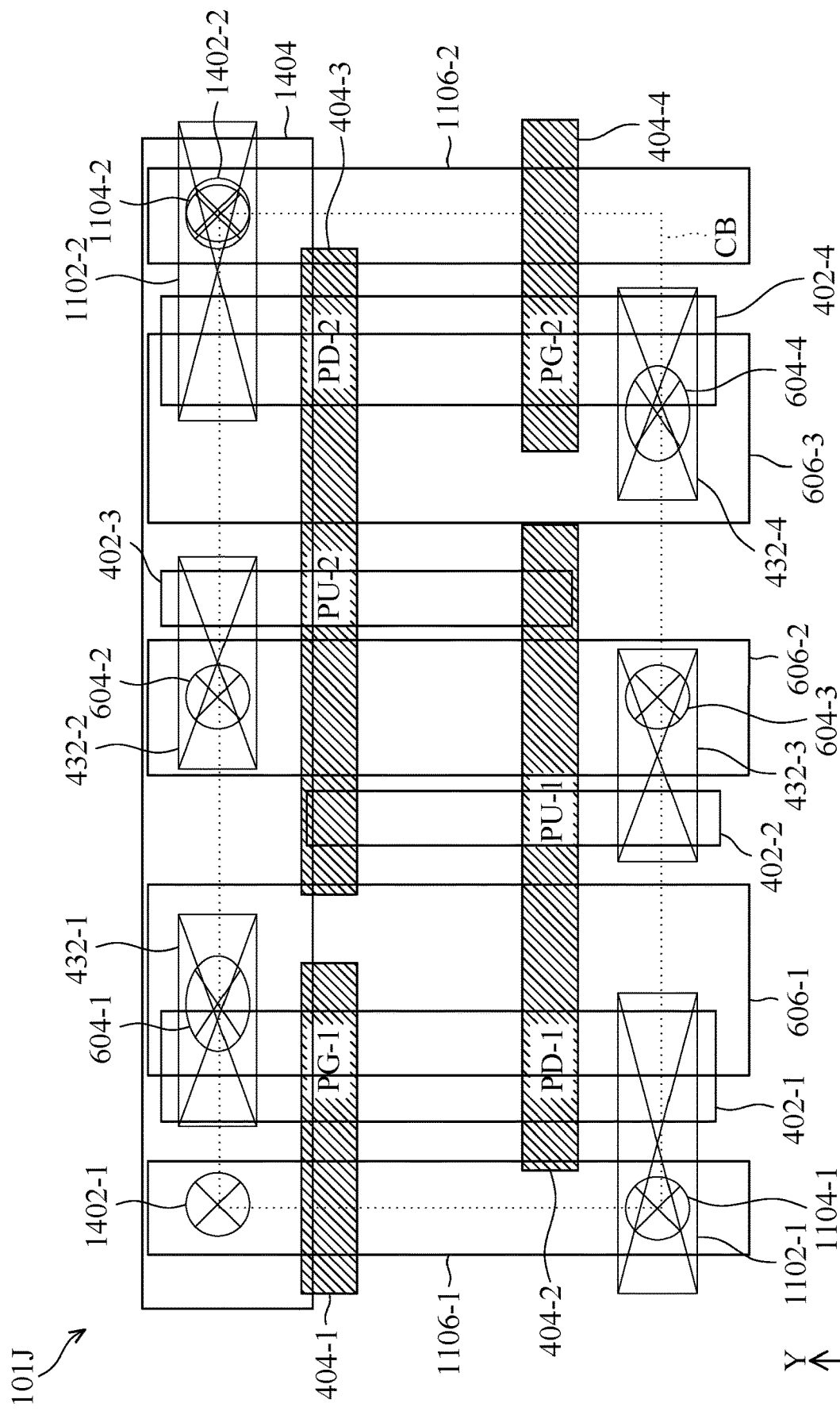

FIGS. 17A and 17B illustrate top views (or layouts) of an SRAM cell 101J that can be one embodiment of the SRAM cells 101 implemented in the array 100, in accordance with some embodiments of the present disclosure. FIG. 17A illustrates the features in the device region (including transistors) and the front-side interconnection structure (including vias and metal conductors), and FIG. 17B illustrates the features in the device region and the back-side interconnection structure.

The SRAM cell 101J is similar to the SRAM cell 101I discussed above, except that the SRAM cell 101J further includes vias 1402 (including vias 1402-1 and 1402-2) and a metal conductor 1404, which are under (or at the back-side of) the transistors in the SRAM cell 101J (e.g., the pass-gate transistors PG-1 and PG-2, the pull-down transistors PD-1 and PD-2, and the pull-up transistors PU-1 and PU-2).

The metal conductor 1404 is in a metal layer BML2 in the IMD layer 608 and extend lengthwise in the X-direction. The metal layer BML2 is under the metal layer BML1, and thus the metal conductor 1404 is under the metal conductors 606 and 1306. The metal conductor 1404 is electrically connected to the metal conductors 1306-1 and 1306-2 to serve as the power mesh line for connecting the voltage node VSS to the metal conductors 1306-1 and 1306-3. As shown in FIGS. 17A and 17B, in the SRAM cell 101J, the metal conductor 1404 is electrically connected to the metal conductor 1306-1 through the via 1402-1 and electrically connected to the metal conductor 1306-2 through the via 1402-2. In some embodiments, the metal conductor 1404 may be referred to as (front-side) VSS power mesh line or VSS power mesh conductor.

Figure 18A:
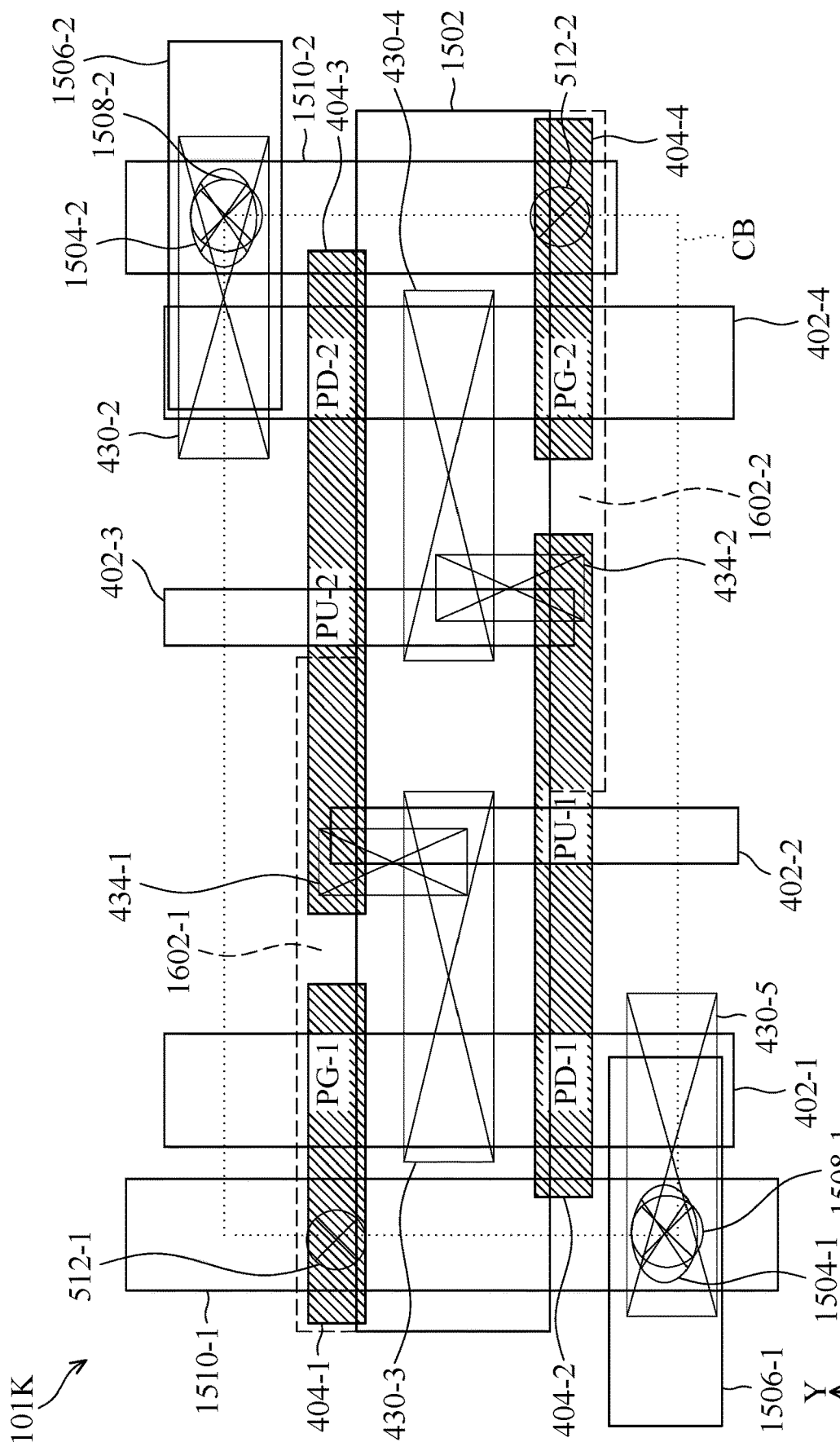
FIGS. 18A and 18B illustrate top views (or layouts) of an SRAM cell that can be one embodiment of the SRAM cells implemented in the array, in accordance with some embodiments of the present disclosure.
Figure 18B:
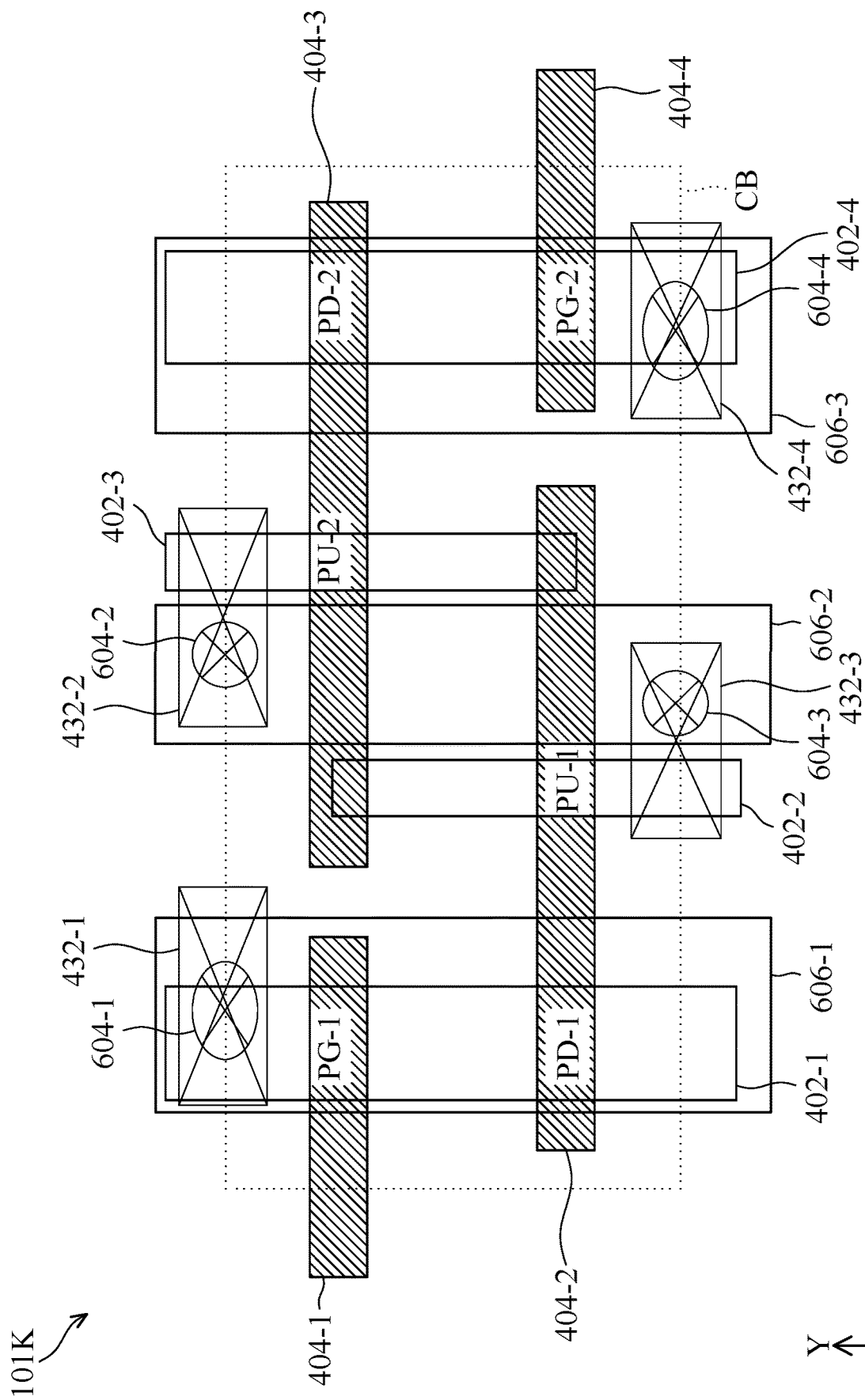

FIGS. 18A and 18B illustrate top views (or layouts) of an SRAM cell 101K that can be one embodiment of the SRAM cells 101 implemented in the array 100, in accordance with some embodiments of the present disclosure. FIG. 18A illustrates the features in the device region (including transistors) and the front-side interconnection structure (including vias and metal conductors), and FIG. 18B illustrates the features in the device region and the back-side interconnection structure.

The SRAM cell 101K is similar to the SRAM cell 101A discussed above, except that the metal conductor for word-line is formed in the metal layer BML1, the metal conductors for VSS lines are formed in the metal layer BML2, and no metal conductor for VDD line in the front-side interconnection structure 502. The vias 504, the metal conductors 506, the vias 508, and the metal conductors 510 shown in the SRAM cell 101A are not formed in the SRAM cell 101G. The SRAM cell 101K further includes a metal conductor 1502, vias 1504 (including vias 1504-1 and 1504-2), metal conductors 1506 (including metal conductors 1506-1 and 1506-2) vias 1508 (including vias 1508-1 and 1508-2), and metal conductors 1510 (including metal conductors 1510-1 and 1510-2) in the front-side interconnection structure 502, which are over (or at the back-side of) the transistors in the SRAM cell 101K (e.g., the pass-gate transistors PG-1 and PG-2, the pull-down transistors PD-1 and PD-2, and the pull-up transistors PU-1 and PU-2).

The metal conductor 1502 is in the metal layer ML1 in the IMD layer 516 and extend lengthwise in the X-direction. In some embodiments, the metal conductor 1502 serves as the word-line that is electrically connected to a controller (e.g., the controller 103 discussed above) and electrically connected to the gate structures (more specifically, the gate electrodes) of the pass-gate transistors in the same row of the array of the SRAM cell. As shown in FIGS. 18A to 18B, in the SRAM cell 101K, the metal conductor 1502 is over the pass-gate transistor PG-1 and PG-2. The metal conductor 1502 is electrically connected to the gate structure 404-1 of the pass-gate transistor PG-1 through the gate via 512-1, and is electrically connected to the gate structure 404-4 of the pass-gate transistor PG-2 through the gate via 512-2. In some embodiments, the metal conductor 1502 may be referred to as (front-side) word-line conductor.

The metal conductors 1506 are in the metal layer ML1 in the IMD layer 516 and extend lengthwise in the X-direction. The metal conductors 1510 are in the metal layer ML2 in the IMD layer 516 and extend lengthwise in the Y-direction. The metal conductors 1510 overlap cell short boundaries of the cell boundary CB of the SRAM cell 101K in the Y-direction, as shown in FIG. 18A. In some embodiments, the metal conductors 1510-1 and 1510-2 serve as the VSS lines that are electrically coupled to a voltage node or voltage source (not shown) (e.g., the voltage node (or voltage source) VSS discussed above) and electrically connected to the source/drain features of the pull-down transistors in the same column of the array of the SRAM cell. As shown in FIGS. 18A and 18B, in the SRAM cell 101K, the metal conductor 1510-1 and 1510-2 are respectively over the pull-down transistor PD-1 and PD-2. The metal conductor 1510-1 is electrically connected to the source/drain features 412N of the pull-down transistor PD-1 through the via 1508-1, the metal conductor 1506-1, the via 1504-1, and the source/drain contact 430-5; and the metal conductor 1510-2 is electrically connected to the source/drain features 412N of the pull-down transistor PD-2 through the via 1508-2, the metal conductor 1506-2, the via 1504-2, and the source/drain contact 430-2. In some embodiments, the metal conductors 1510-1 and 1510-2 may be referred to as (front-side) VSS conductors or (front-side) VSS lines.

As shown in FIG. 18A, the metal conductor 1502 for word-line is non-rectangular shape. The metal conductor 1502 further includes protrusion portions 1602-1 and 1602-2. The protrusion portions 1602-1 and 1602-2 extend lengthwise in the X-direction and protrude from the metal conductor 1502 in the Y-direction. In some embodiments, the protrusion portions 1602-1 and 1602-2 are respectively separated from the active areas 402-3 and 402-2 in the top view. Such metal conductor 1502 with protrusion portions 1602-1 and 1602-2 may have lower resistance because the area of the metal conductor 1502 is enlarged.

The embodiments disclosed herein relate to memory structures, and more particularly to memory structures comprising the metal conductors for the bit-line and bit-line-bar that are under or at the back-side of the SRAM cells (more specifically, functional transistors). Furthermore, the present embodiments provide one or more of the following advantages. The metal conductors for bit-line and bit-line-bar at the back-side provides a reduced routing complexity for the SRAM cells, a lower circuit resistance, and a lower parasitic capacitance, which improves the performance of the SRAM cells, such as RC delay. Furthermore, the gate structures do not affect (back-side) source/drain contacts electrically connected to the metal conductors for bit-line and bit-line-bar, thereby improving the reliability of the read/write operations of the SRAM cells.

Thus, one of the embodiments of the present disclosure describes a memory structure that includes a static random-access memory (SRAM) cell, a word-line conductor extending in a first direction, a first source/drain contact, a second source/drain contact, a bit-line conductor extending in a second direction, and a bit-line-bar conductor extending in the second direction. The second direction is perpendicular to the first direction. The SRAM cell has a first pass-gate transistor and a second pass-gate transistor. The word-line conductor is over and electrically connected to gate electrodes of the first pass-gate transistor and the second pass-gate transistor. The first source/drain contact is under and electrically connected to a source/drain feature of the first pass-gate transistor. The second source/drain contact is under and electrically connected to a source/drain feature of the second pass-gate transistor. The bit-line conductor is under and electrically connected to the first source/drain contact. The bit-line conductor is under and electrically connected to the second source/drain contact.

In some embodiments, the bit-line conductor is in contact with the first source/drain contact and the bit-line-bar conductor is in contact with the second source/drain contact.

In some embodiments, the memory structure further includes a first via vertically between the first source/drain contact and the bit-line conductor, and a second via vertically between the second source/drain contact and the bit-line-bar conductor. The bit-line conductor is electrically connected to the first source/drain contact through the first via. The bit-line conductor is electrically connected to the second source/drain contact through the first via.

In some embodiments, the SRAM cell further includes a first pull-up transistor and a second pull-up transistor. The memory structure further includes a first VDD conductor extending in the second direction and under the first pull-up transistor and the second pull-up transistor. The first VDD conductor is electrically connected source/drain features of the first pull-up transistor and the second pull-up transistor.

In some embodiments, the memory structure further includes a second VDD conductor extending in the second direction and over the first pull-up transistor and the second pull-up transistor. The first VDD conductor is electrically connected to the source/drain features of the first pull-up transistor and the second pull-up transistor.

In some embodiments, the SRAM cell further includes a first pull-down transistor and a second pull-down transistor. The memory structure further includes a first VSS conductor extending in the second direction and electrically connected to a source/drain feature of the first pull-down transistor, and a second VSS conductor extending in the second direction and electrically connected to a source/drain feature of the second pull-down transistor.

In some embodiments, the first VSS conductor and the second VSS conductor are respectively under the first pull-down transistor and the second pull-down transistor.

In some embodiments, the first VSS conductor and the second VSS conductor are respectively over the first pull-down transistor and the second pull-down transistor.

In some embodiments, the memory structure further includes a VSS power mesh conductor extending in the first direction. The VSS power mesh conductor is over and electrically connected to the first VSS conductor and the second VSS conductor.

In some embodiments, the memory structure further includes a first word-line landing pad extending in the second direction and over the first pass-gate transistor, and a second word-line landing pad extending in the second direction and over the second pass-gate transistor. The word-line conductor is electrically connected to the gate electrodes of the first pass-gate transistor and the second pass-gate transistor respectively through the first word-line landing pad and the second word-line landing pad.

In another of the embodiments, discussed is a memory structure including a static random-access memory (SRAM) cell, a first metal layer under the SRAM cell, a second metal layer over the SRAM cell, and a third metal layer over the second metal layer. The SRAM cell has a first pass-gate transistor, a second pass-gate transistor, a first pull-down transistor, and a second pull-down transistor. The first metal layer includes a bit-line conductor and a bit-line-bar conductor extending in a first direction. The bit-line conductor is electrically connected to a source/drain feature of the first pass-gate transistor. The bit-line-bar conductor is electrically connected to a source/drain feature of the second pass-gate transistor. The second metal layer includes a first VSS conductor and a second VSS conductor extending in the first direction. The first VSS conductor is electrically connected to a source/drain feature of the first pull-down transistor. The second VSS conductor is electrically connected to a source/drain feature of the second pull-down transistor. The third metal layer includes a word-line conductor extending in a second direction. The second direction is perpendicular to the first direction. The word-line conductor is electrically connected to gate electrodes of the first pass-gate transistor and the second pass-gate transistor.

In some embodiments, the SRAM cell further includes a first pull-up transistor and a second pull-up transistor. The first metal layer further includes a first VDD conductor extending in the first direction and electrically connected to source/drain features of the first pull-up transistor and the second pull-up transistor.

In some embodiments, the second metal layer further includes a second VDD conductor extending in the first direction and electrically connected to the source/drain features of the first pull-up transistor and the second pull-up transistor.

In some embodiments, the first metal layer further includes a third VSS conductor and a fourth VSS conductor extending in the first direction. The third VSS conductor is electrically connected to the source/drain feature of the first pull-down transistor. The fourth VSS conductor is electrically connected to the source/drain feature of the second pull-down transistor.

In some embodiments, the memory structure further includes a fourth metal layer under the first metal layer. The fourth metal layer includes a VSS power mesh conductor extending in the second direction. The VSS power mesh conductor is electrically connected to the third VSS conductor and the fourth VSS conductor.

In some embodiments, the third VSS conductor and the fourth VSS conductor overlap cell short boundaries of the SRAM cell.

In yet another of the embodiments, discussed is a memory structure that includes an array of static random-access memory (SRAM) cells, bit-line conductors and bit-line-bar conductors, first VSS conductors and second VSS conductors, word-line conductors, first VDD conductors, and second VDD conductors. Each of the SRAM cells comprises a first pass-gate transistor, a second pass-gate transistor, a first pull-down transistor, a second pull-down transistor, a first pull-up transistor, and a second pull-up transistor. The bit-line conductors and the bit-line-bar conductors in a first metal layer under the SRAM cell and extend in a first direction. The bit-line conductors are electrically connected to source/drain features of the first pass-gate transistors. The bit-line-bar conductors are electrically connected to source/drain features of the second pass-gate transistors. The first VSS conductors and the second VSS conductors in a second metal layer over the SRAM cell and extend in the first direction. The first VSS conductors are electrically connected to source/drain features of the first pull-down transistors. The second VSS conductors are electrically connected to source/drain features of the second pull-down transistors. The word-line conductors in a third metal layer over the second metal layer and extend in a second direction perpendicular to the first direction. The word-line conductors are electrically connected to gate electrodes of the first pass-gate transistors and the second pass-gate transistors. The first VDD conductors in the second metal layer and extend in the first direction. The first VDD conductors are electrically connected to source/drain features of the first pull-up transistor and the second pull-up transistor. The second VDD conductors in the first metal layer and extend in the first direction. The second VDD conductors are electrically connected to the source/drain features of the first pull-up transistor and the second pull-up transistor.

In some embodiments, the memory structure further includes an edge strap region on an edge of the array of the SRAM cells. The edge strap region includes front-side bit-line conductors in the second metal layer, and bit-line tap structures electrically connecting bit-line conductors to the front-side bit-line conductors.

In some embodiments, the memory structure further includes VSS power mesh conductors in the third metal layer and extending in the second direction. The VSS power mesh conductors are electrically connected to the first VSS conductors and the second VSS conductors.

In some embodiments, the word-line conductors in the third metal layer are first word-line conductors. The memory structure further includes second word-line conductors extending in the second direction and over the first word-line conductors. The second word-line conductors are electrically connected to the first word-line conductors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure, comprising:
    a static random-access memory (SRAM) cell having a first pass-gate transistor and a second pass-gate transistor;
    a word-line conductor extending in a first direction, wherein the word-line conductor is over and electrically connected to gate electrodes of the first pass-gate transistor and the second pass-gate transistor;
    a first source/drain contact under and electrically connected to a source/drain feature of the first pass-gate transistor;
    a second source/drain contact under and electrically connected to a source/drain feature of the second pass-gate transistor;
    a bit-line conductor extending in a second direction perpendicular to the first direction, wherein the bit-line conductor is under and electrically connected to the first source/drain contact;

a bit-line-bar conductor extending in the second direction, wherein the bit-line-bar conductor is under and electrically connected to the second source/drain contact;
a first word-line landing pad extending in the second direction and over the first pass-gate transistor; and
a second word-line landing pad extending in the second direction and over the second pass-gate transistor,
wherein the word-line conductor is electrically connected to the gate electrodes of the first pass-gate transistor and the second pass-gate transistor respectively through the first word-line landing pad and the second word-line landing pad.

2. The memory structure of claim 1, wherein the bit-line conductor is in contact with the first source/drain contact and the bit-line-bar conductor is in contact with the second source/drain contact.

3. The memory structure of claim 1, further comprising:
a first via vertically between the first source/drain contact and the bit-line conductor, wherein the bit-line conductor is electrically connected to the first source/drain contact through the first via; and
a second via vertically between the second source/drain contact and the bit-line-bar conductor, wherein the bit-line-bar conductor is electrically connected to the second source/drain contact through the second-first via.

4. The memory structure of claim 1,
wherein the SRAM cell further comprises a first pull-up transistor and a second pull-up transistor, and
wherein the memory structure further comprises:
a first VDD conductor extending in the second direction and under the first pull-up transistor and the second pull-up transistor, wherein the first VDD conductor is electrically connected source/drain features of the first pull-up transistor and the second pull-up transistor.

5. The memory structure of claim 4, further comprising:
a second VDD conductor extending in the second direction and over the first pull-up transistor and the second pull-up transistor, wherein the second VDD conductor is electrically connected to the source/drain features of the first pull-up transistor and the second pull-up transistor.

6. The memory structure of claim 1,
wherein the SRAM cell further comprises a first pull-down transistor and a second pull-down transistor, and
wherein the memory structure further comprises:
a first VSS conductor extending in the second direction and electrically connected to a source/drain feature of the first pull-down transistor; and
a second VSS conductor extending in the second direction and electrically connected to a source/drain feature of the second pull-down transistor.

7. The memory structure of claim 6, wherein the first VSS conductor and the second VSS conductor are respectively under the first pull-down transistor and the second pull-down transistor.

8. The memory structure of claim 6, wherein the first VSS conductor and the second VSS conductor are respectively over the first pull-down transistor and the second pull-down transistor.

9. The memory structure of claim 8, further comprising:
a VSS power mesh conductor extending in the first direction, wherein the VSS power mesh conductor is over and electrically connected to the first VSS conductor and the second VSS conductor.

10. A memory structure, comprising:
a static random-access memory (SRAM) cell having a first pass-gate transistor, a second pass-gate transistor, a first pull-down transistor, and a second pull-down transistor;
a first metal layer under the SRAM cell, wherein the first metal layer comprises a bit-line conductor and a bit-line-bar conductor extending in a first direction, wherein the bit-line conductor is electrically connected to a source/drain feature of the first pass-gate transistor and the bit-line-bar conductor is electrically connected to a source/drain feature of the second pass-gate transistor;
a second metal layer over the SRAM cell, wherein the second metal layer comprises a first VSS conductor and a second VSS conductor extending in the first direction, wherein the first VSS conductor is electrically connected to a source/drain feature of the first pull-down transistor and the second VSS conductor is electrically connected to a source/drain feature of the second pull-down transistor; and
a third metal layer over the second metal layer, wherein the third metal layer comprises a word-line conductor extending in a second direction perpendicular to the first direction, wherein the word-line conductor is electrically connected to gate electrodes of the first pass-gate transistor and the second pass-gate transistor.

11. The memory structure of claim 10, wherein the SRAM cell further comprises a first pull-up transistor and a second pull-up transistor, and wherein the first metal layer further comprises a first VDD conductor extending in the first direction and electrically connected to source/drain features of the first pull-up transistor and the second pull-up transistor.

12. The memory structure of claim 11, wherein the second metal layer further comprises a second VDD conductor extending in the first direction and electrically connected to the source/drain features of the first pull-up transistor and the second pull-up transistor.

13. The memory structure of claim 10, wherein the first metal layer further comprises a third VSS conductor and a fourth VSS conductor extending in the first direction, wherein the third VSS conductor is electrically connected to the source/drain feature of the first pull-down transistor and the fourth VSS conductor is electrically connected to the source/drain feature of the second pull-down transistor.

14. The memory structure of claim 13, further comprising:
a fourth metal layer under the first metal layer, wherein the fourth metal layer comprises a VSS power mesh conductor extending in the second direction, wherein the VSS power mesh conductor is electrically connected to the third VSS conductor and the fourth VSS conductor.

15. The memory structure of claim 13, wherein the third VSS conductor and the fourth VSS conductor overlap cell short boundaries of the SRAM cell.

16. The memory structure of claim 10, further comprising:
a first word-line landing pad extending in the first direction and over the first pass- gate transistor; and
a second word-line landing pad extending in the first direction and over the second pass-gate transistor,
wherein the word-line conductor is electrically connected to the gate electrodes of the first pass-gate transistor and the second pass-gate transistor respectively through the first word-line landing pad and the second word-line landing pad.

17. A memory structure, comprising:
an array of static random-access memory (SRAM) cells, wherein each of the SRAM cells comprises a first pass-gate transistor, a second pass-gate transistor, a first pull-down transistor, a second pull-down transistor, a first pull-up transistor, and a second pull-up transistor;
bit-line conductors and bit-line-bar conductors in a first metal layer under the SRAM cells and extending in a first direction, wherein the bit-line conductors are electrically connected to source/drain features of the first pass-gate transistors and the bit-line-bar conductors are electrically connected to source/drain features of the second pass-gate transistors;
first VSS conductors and second VSS conductors in a second metal layer over the SRAM cells and extending in the first direction, wherein the first VSS conductors are electrically connected to source/drain features of the first pull-down transistors and the second VSS conductors are electrically connected to source/drain features of the second pull-down transistors;
word-line conductors in a third metal layer over the second metal layer and extending in a second direction perpendicular to the first direction, wherein the word-line conductors are electrically connected to gate electrodes of the first pass-gate transistors and the second pass-gate transistors;
first VDD conductors in the second metal layer and extending in the first direction, wherein the first VDD conductors are electrically connected to source/drain features of the first pull-up transistor and the second pull-up transistor; and
second VDD conductors in the first metal layer and extending in the first direction, wherein the second VDD conductors are electrically connected to the source/drain features of the first pull-up transistor and the second pull-up transistor.

18. The memory structure of claim 17, further comprising:
an edge strap region on an edge of the array of the SRAM cells, wherein the edge strap region comprises:
front-side bit-line conductors in the second metal layer; and
bit-line tap structures electrically connecting the bit-line conductors to the front-side bit-line conductors.

19. The memory structure of claim 17, further comprising:
VSS power mesh conductors in the third metal layer and extending in the second direction, wherein the VSS power mesh conductors are electrically connected to the first VSS conductors and the second VSS conductors.

20. The memory structure of claim 17, wherein the word-line conductors in the third metal layer are first word-line conductors, wherein the memory structure further comprises:
second word-line conductors extending in the second direction and over the first word-line conductors, wherein the second word-line conductors are electrically connected to the first word-line conductors.

* * * * *